United States Patent
Matsuo et al.

(10) Patent No.: US 7,336,221 B2
(45) Date of Patent: Feb. 26, 2008

(54) HIGH FREQUENCY PACKAGE, TRANSMITTING AND RECEIVING MODULE AND WIRELESS EQUIPMENT

(75) Inventors: Koichi Matsuo, Tokyo (JP); Tsutomu Tamaki, Tokyo (JP); Takuya Suzuki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 271 days.

(21) Appl. No.: 10/555,651

(22) PCT Filed: Mar. 24, 2005

(86) PCT No.: PCT/JP2005/005432

§ 371 (c)(1),
(2), (4) Date: Nov. 4, 2005

(87) PCT Pub. No.: WO2005/093828

PCT Pub. Date: Oct. 6, 2005

(65) Prior Publication Data

US 2007/0040735 A1    Feb. 22, 2007

(30) Foreign Application Priority Data

| Mar. 26, 2004 | (JP) | ............................. 2004-092043 |
| Mar. 26, 2004 | (JP) | ............................. 2004-092044 |
| Mar. 23, 2005 | (JP) | ............................. 2005-083810 |
| Mar. 23, 2005 | (JP) | ............................. 2005-083811 |

(51) Int. Cl.
*G01S 7/28* (2006.01)
(52) U.S. Cl. ..................... 342/175; 342/70; 342/109
(58) Field of Classification Search ................ 342/175, 342/70, 109; 343/700 MS
See application file for complete search history.

(56) References Cited

U.S. PATENT DOCUMENTS

| 5,634,208 A * | 5/1997 | Nishikawa et al. ......... 455/327 |
| 6,194,750 B1 * | 2/2001 | Carroll et al. .............. 257/275 |
| 6,809,688 B2 * | 10/2004 | Yamada ............... 343/700 MS |
| 2005/0030231 A1 * | 2/2005 | Nagaishi et al. ..... 343/700 MS |

(Continued)

FOREIGN PATENT DOCUMENTS

EP    661771 A2 *    7/1995

(Continued)

*Primary Examiner*—John B Sotomayor
(74) *Attorney, Agent, or Firm*—Oblon, Spivak, McClelland, Maier & Neustadt, P.C.

(57) ABSTRACT

A multilayer dielectric substrate includes a first signal via, a second signal via, an internal-layer signal line, an internal-layer ground conductor, and ground vias. The first signal via is connected to a bias-and-control-signal terminal of a high-frequency semiconductor, and is arranged within a region corresponding to the electromagnetic shielding members. The second signal via is arranged outside the region, and is connected to an external terminal for a bias and control signal. The internal-layer signal line connects between the first and the second signal vias. The internal-layer ground conductor is arranged around the first and the second signal vias and the internal-layer signal line. The ground vias are arranged around the first and the second signal vias and the internal-layer signal line, on the internal-layer ground conductor. A resistance film is provided on at least one of an upper surface and a lower surface of the internal-layer signal line.

27 Claims, 20 Drawing Sheets

U.S. PATENT DOCUMENTS

2005/0236689 A1* 10/2005 Sugiura et al. ............. 257/531
2007/0040735 A1* 2/2007 Matsuo et al. .............. 342/175
2007/0200204 A1* 8/2007 Suzuki et al. ............... 257/664

FOREIGN PATENT DOCUMENTS

| | | |
|---|---|---|
| JP | 5-299906 | 11/1993 |
| JP | 2000-031812 | 1/2000 |
| JP | 2003-133471 | 5/2003 |
| JP | 2003-133801 | 5/2003 |

* cited by examiner

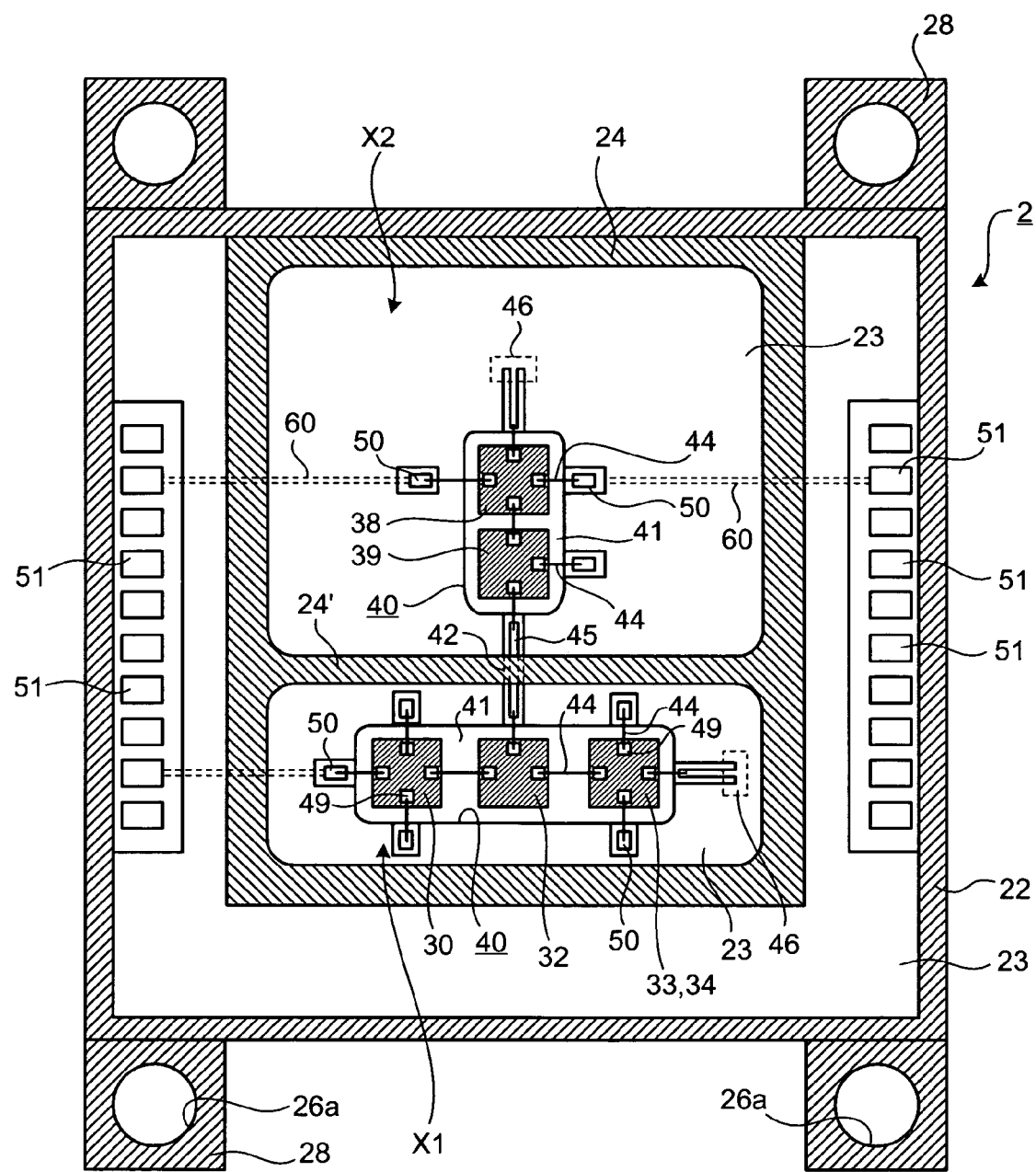

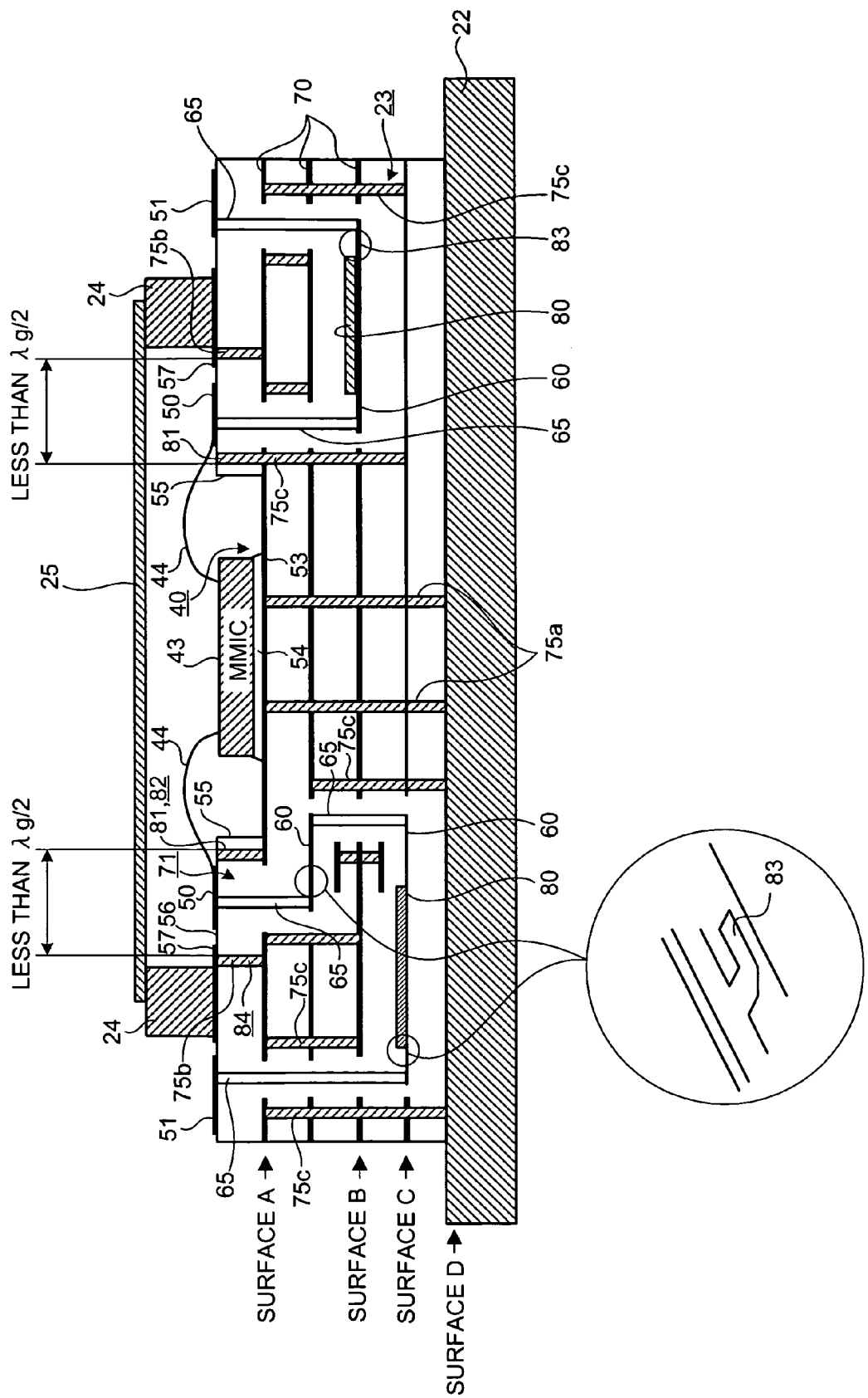

SURFACE A

SURFACE B

SURFACE C

SURFACE D

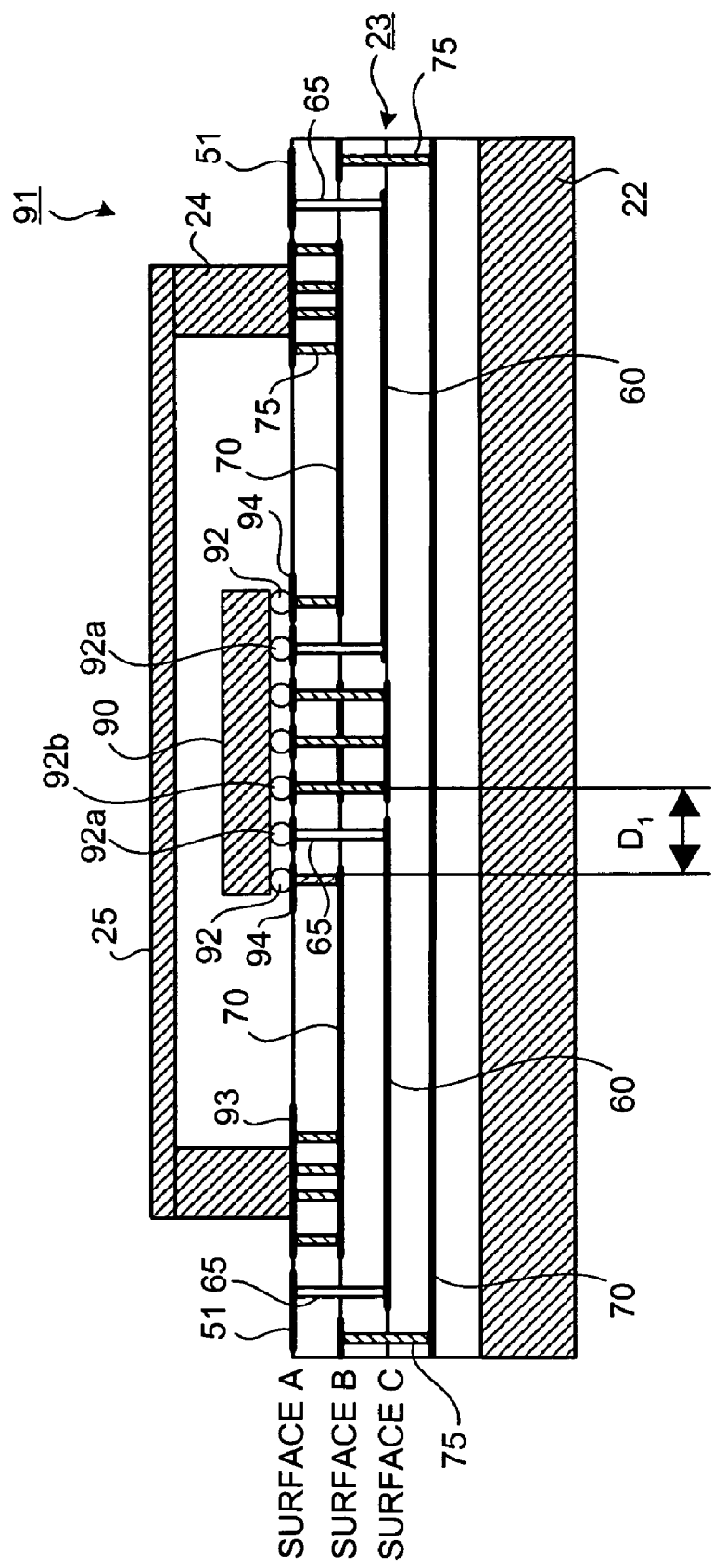

SURFACE A

SURFACE B

SURFACE C

HIGH FREQUENCY PACKAGE, TRANSMITTING AND RECEIVING MODULE AND WIRELESS EQUIPMENT

TECHNICAL FIELD

The present invention relates to a high-frequency package that includes a high-frequency semiconductor that operates in a high-frequency band such as a microwave band and a milliwave band, a transmission/reception module, and a radio device that include the high-frequency package. More particularly, the present invention relates to a high-frequency package that can suppress leakage of a high-frequency signal generated from the high-frequency semiconductor to outside, a transmission/reception module, and a radio device that include the high-frequency package.

BACKGROUND ART

Conventionally, radio device, for example, a milliwave radar mounted on a vehicle uses electromagnetic waves of a milliwave band, and detects a distance and a relative speed between the vehicle and a vehicle running in front to be applied to achieve a cruise control and a safety measure to reduce damage on a driver when a collision cannot be avoided. In many cases, such an in-vehicle milliwave radar multiplies 1/N (where N is a positive integer of 2 or larger) of a frequency to obtain a high-frequency transmission signal of a milliwave band. In this case, many frequency components are present in a module. Therefore, it is very difficult to satisfy a desired electromagnetic interference (EMI) characteristic.

In the in-vehicle milliwave radar, a transmission/reception module usually includes a high-frequency package including a high-frequency semiconductor for a radar device, a control/interface substrate that applies a bias signal and a control signal to the high-frequency package, and a waveguide. To satisfy the EMI characteristic, conventionally, a whole body of the transmission/reception module is configured to be covered with a metallic cover.

However, when such a configuration that the transmission/reception module is covered with the metallic cover is applied, an expensive casing and the like are necessary. Therefore, to reduce manufacturing cost, it is necessary to take measures within the high-frequency package.

According to patent literature 1, an integrated circuit part for a high-frequency signal and a dielectric substrate are mounted on a metallic base member, with a micro slip line formed on the dielectric substrate. These parts are covered with a metallic frame member and a metallic lid member. To the integrated circuit part for a high-frequency signal mounted on the base, a bias is applied via a bias terminal.

Patent Literature 1: Japanese Patent Application Laid-Open No. 2000-31812

DISCLOSURE OF INVENTION

Problem to be Solved by the Invention

In the above conventional technique, a high-frequency package is covered with a metallic base, a metallic frame member, and a metallic lid member. Therefore, leakage of a high-frequency component to the outside is suppressed to some extent, however, no countermeasure is taken against leakage of a high-frequency component via the bias terminal. Consequently, there is a problem that an unnecessary high-frequency component that is electromagnetically coupled to the dielectric substrate in the high-frequency package and the bias terminal is discharged straight to the outside via the bias terminal.

In view of the above problems, it is an object of the present invention to provide a high-frequency package, a transmission/reception module, and a radio device having high-frequency shielding performance at low cost, by providing a structure, inside the high-frequency package, to suppress leakage of a high-frequency component outside.

Means for Solving Problem

To solve the above problems and achieve the object, according to the present invention, a high-frequency package includes a high-frequency semiconductor; a multilayer dielectric substrate having the high-frequency semiconductor mounted on a surface-layer ground conductor; and an electromagnetic shielding member configured to cover a part of a surface layer of the multilayer dielectric substrate and the high-frequency semiconductor. The multilayer dielectric substrate includes a first signal via configured to be connected to a bias-and-control-signal terminal of the high-frequency semiconductor, and arranged inside the electromagnetic shielding member; a second signal via arranged outside the electromagnetic shielding member, and configured to be connected to an external terminal for a bias and control signal; an internal-layer signal line configured to connect between the first signal via and the second signal via; an internal-layer ground conductor arranged around the first signal via, the second signal via, and the internal-layer signal line; and a plurality of ground vias arranged around the first signal via, the second signal via, and the internal-layer signal line, on the internal-layer ground conductor. A resistance film is provided on at least one of an upper surface and a lower surface of the internal-layer signal line.

According to the present invention, the resistance film is provided on at least one of the upper surface and the lower surface of the internal-layer signal line through which the bias and control signal is transmitted. Therefore, a resistive element absorbs the high-frequency signal coupled to the internal-layer signal line, based on the skin effect, and a bias voltage or a control signal can be transmitted without a voltage drop.

According to a next aspect of the present invention, a high-frequency package includes a high-frequency semiconductor including a bias-and-control-signal terminal; a multilayer dielectric substrate including a surface-layer ground conductor configured to mount the high-frequency semiconductor; and an electromagnetic shielding member configured to cover a part of a surface layer of the multilayer dielectric substrate and the high-frequency semiconductor. The multilayer dielectric substrate includes a first signal via configured to be connected to the bias-and-control-signal terminal, and arranged inside the electromagnetic shielding member; a second signal via arranged outside the electromagnetic shielding member, and configured to be connected to an external terminal for a bias and control signal; an internal-layer signal line configured to connect between the first signal via and the second signal via; an internal-layer ground conductor arranged around the first signal via, the second signal via, and the internal-layer signal line; and a plurality of ground vias arranged around the first signal via, the second signal via, and the internal-layer signal line, on the internal-layer ground conductor. A slot line having a length approximately a quarter of an effective wavelength of a high-frequency signal used in the high-frequency semiconductor is provided on the internal-layer signal line.

According to the present invention, a slot line having a length of approximately a quarter of an effective wavelength of a high-frequency signal used in a high-frequency semiconductor is provided on an internal-layer signal line for a bias and control signal. With this arrangement, even when a high-frequency component enters a multilayer dielectric substrate from a dielectric layer on a surface layer of the multilayer dielectric substrate and is electromagnetically coupled to a signal via for the bias and control signal or to an internal-layer signal line, the high-frequency component is reflected at the position of the slot line, thereby suppressing passage of the high-frequency component to an external terminal.

According to a next invention, a high-frequency package includes a high-frequency semiconductor; a multilayer dielectric substrate including a surface-layer ground conductor configured to mount the high-frequency semiconductor, and an internal-layer ground conductor configured to be connected to the surface-layer ground conductor; and an electromagnetic shielding member configured to cover a part of a surface layer of the multilayer dielectric substrate and the high-frequency semiconductor. The multilayer dielectric substrate includes a first signal via configured to be connected to a bias-and-control-signal terminal of the high-frequency semiconductor, and arranged inside the electromagnetic shielding member; a second signal via arranged outside the electromagnetic shielding member, and configured to be connected to an external terminal for a bias and control signal; an internal-layer signal line configured to connect between the first signal via and the second signal via; a first ground via string arranged at a portion closer to the high-frequency semiconductor than the first signal via, and including a plurality of ground vias configured to be connected to the internal-layer ground conductor; and a second ground via string arranged between the first signal via and the second signal via, and including a plurality of ground vias configured to be connected to the internal-layer ground conductor. A distance between the first ground via string and the second ground via string is less than a half of an effective wavelength of a high-frequency signal used in the high-frequency semiconductor, and a distance between adjacent ground vias in the first and the second ground via strings respectively is less than a half of the effective wavelength of the high-frequency signal used in the high-frequency semiconductor.

According to the invention, a distance between a first ground via string and a second ground via string is set to less than a half of an effective wavelength of a high-frequency signal used in a high-frequency semiconductor. With this arrangement, entrance of a high-frequency component to a direction along the ground via within the multilayer dielectric substrate can be suppressed. Since the distance between the first ground via string and the second ground via string is set to less than a half of the effective wavelength of a high-frequency signal used in the high-frequency semiconductor, entrance of a high-frequency component to a direction perpendicular to the ground via string within the multilayer dielectric substrate is also suppressed.

Effect of the Invention

According to the present invention, a resistance film is provided on at least one of the upper surface and the lower surface of the internal-layer signal line through which the bias and control signal is transmitted. Therefore, a resistive element absorbs the high-frequency signal coupled to the internal-layer signal line, based on the skin effect, and a bias voltage or a control signal can be transmitted without a voltage drop. Accordingly, based on a low-cost configuration, the high-frequency signal can be suppressed from being discharged to the outside of the high-frequency package through the signal via, the internal-layer signal line, and the external terminal.

According to the next invention, a slot line having a length of approximately a quarter of an effective wavelength of a high-frequency signal used in-a high-frequency semiconductor is provided on an internal-layer signal line for a bias and control signal. With this arrangement, a high-frequency component that enters a multilayer dielectric substrate is reflected at the position of the slot line, thereby suppressing passage of the high-frequency component to an external terminal. Therefore, leakage of a high-frequency component to the outside of the high-frequency package can be securely suppressed. Since the leakage of the high-frequency component to the outside of the high-frequency package can be suppressed inside the high-frequency package, manufacturing cost can be decreased.

According to the next invention, a distance between a first ground via string and a second ground via string is set to less than a half of an effective wavelength of a high-frequency signal used in a high-frequency semiconductor. With this arrangement, entrance of a high-frequency component to a direction along the ground via within the multilayer dielectric substrate can be suppressed. Since the distance between the first ground via string and the second ground via string is set to less than a half of the effective wavelength of a high-frequency signal used in the high-frequency semiconductor, entrance of a high-frequency component to a direction perpendicular to the ground via string within the multilayer dielectric substrate is also suppressed. Therefore, according to the present invention, a coupling of a high-frequency signal to the signal via within the multilayer dielectric substrate or to the internal-layer signal line can be suppressed. Further, discharging of an unnecessary wave to the outside of the high-frequency package via the signal via, the internal-layer signal line, and the external terminal can be suppressed.

BRIEF DESCRIPTION OF DRAWINGS

FIG. 5 is a plan view of the high-frequency package according to the first embodiment;

FIG. 6 is a detailed cross-section of a via structure of a multilayer dielectric substrate of the high-frequency package;

FIG. 24 is a cross-section of a high-frequency package according to a fifth embodiment of the present invention;

EXPLANATIONS OF LETTERS OR NUMERALS

Figure 1:
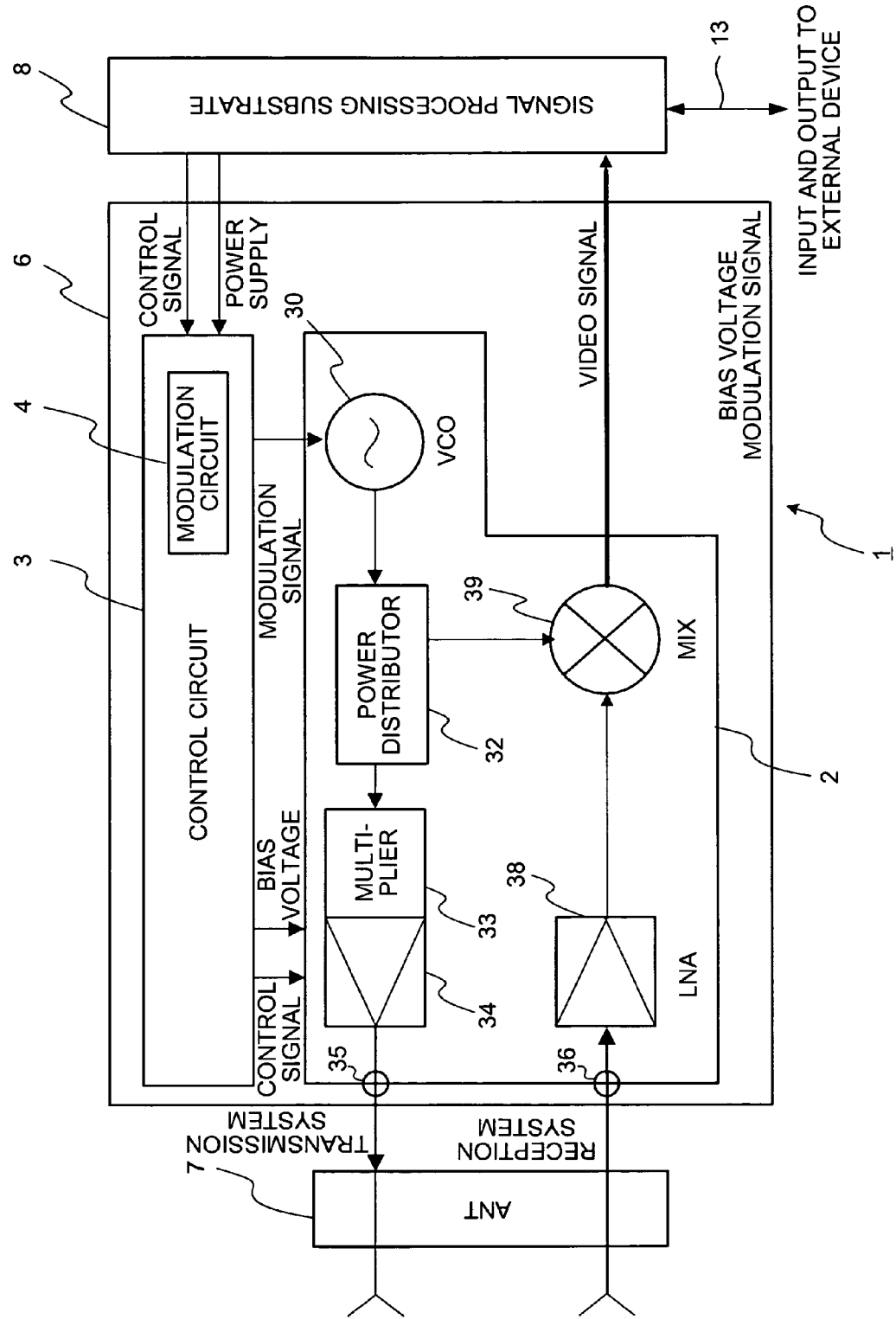
FIG. 1 is a functional block diagram of an FM-CW radar device to which the present invention is applied.

1 Radar device
2, 2', 91 High-frequency packages
3 Control circuit
4 Modulation circuit
6 Transmission/reception module
7 Antenna
8 Signal processing substrate
10 Casing
12 Radome
13 Cable
14 Connector
16 Waveguide
17 Waveguide plate
19 Electronic circuit
21 Module control substrate
22 Carrier
23 Multilayer dielectric substrate
24 Seal ring
25 Cover
30 Oscillator
32 Power distributor
33 Multiplier
35 Transmission waveguide terminal
36 Reception waveguide terminal
37 MMIC
39 Mixer
40 Cavity
42 Feed-through
43, 66, 90 High-frequency semiconductors
44 Wires
45 Microstrip line
50 Bias and control signal pad
51, 52 External terminals
53 Ground surface
55 Sidewall
56, 61 Dielectric material
57 Side edge surface-layer ground pattern
60 Internal-layer signal line
65 Signal via
70 Internal-layer ground conductor
71, 71a Cavity side edges
75, 75a, 75b, 75c Ground vias
80 Resistance film
81 Sidewall ground via
82 Sidewall ground via string
83 Slot line
84 Ground via string (shield via string)
85 Ground pattern
86 Low-pass filter
87 Ground-extracted part
92 Bump
92a Signal bump
92b Ground bump
93 Surface-layer ground conductor
94 Conductor pad
$\lambda g$ Effective wavelength

BEST MODE(S) FOR CARRYING OUT THE INVENTION

Exemplary embodiments of a high-frequency package, a transmission/reception module, and a radar device according to the present invention will be explained in detail with reference to the accompanying drawings. The present invention is not limited by the embodiments.

First Embodiment

A first embodiment of the present invention is explained below with reference to FIG. 1 to FIG. 18. FIG. 1 is a functional block diagram of a radar device 1 that includes a radio device to which the present invention is applied. A functional internal configuration of the radar device 1 is explained first with reference to FIG. 1.

The radar device 1 is an FM-CW radar having a function of detecting a distance and a relative speed between with respect to a target object (such as a vehicle) in front, using electromagnetic waves of a milliwave band (for example, 76 GHz). The FM-CW radar irradiates a frequency modulated high-frequency signal (a transmission signal) to the target, detects a difference in frequency between the transmission signal and a signal reflected from the target (a reception signal), and calculates a distance and a relative speed with respect to the target.

As shown in FIG. 1, the radar device 1 includes a transmission/reception module 6, an antenna 7 that is formed with a transmission/reception antenna, and a signal processing substrate 8 that is connected to an external device to carry out various kinds of signal processing. The transmission/reception module 6 includes a high-frequency package 2, a control circuit 3 that drive controls various kinds of high-frequency semiconductor elements within the high-frequency package 2, and a modulation circuit 4.

The signal processing substrate 8 has a function of controlling the entire radar device 1, and analyzes a frequency of a fast Fourier transform (FFT) based on a video signal obtained from the transmission/reception module 6, thereby acquiring a distance and a relative speed with respect to the target.

The modulation circuit 4 outputs a transmission-frequency modulating voltage in accordance with a control signal from the signal processing substrate 8. The control circuit 3 operates based on an input control signal (such as a synchronous clock), and outputs a bias voltage, a control signal of a monolithic microwave IC (MMIC), and a modulation signal to the package 2.

The high-frequency package 2 includes a voltage control oscillator (VCO) 30, a power distributor 32, a multiplier 33, an amplifier 34, a transmission terminal 35 formed with a waveguide terminal, a reception terminal 36, a low-noise amplifier (LNA) 38, and a mixer (MIX) 39. The high-frequency package 2 has a size of, for example, 10 mm to 40 mm square.

Operation of the respective units is explained next. The voltage control oscillator 30 outputs a frequency modulated high-frequency signal. The power distributor 32 distributes the output from the voltage control oscillator 30 to two directions. The multiplier 33 receives one of the outputs from the power distributor 32, multiplies the frequency by N (where N is a positive integer and N≧2), and outputs the multiplied result. The amplifier 34 power amplifies the output from the multiplier 33, and outputs a transmission signal to the transmission terminal 35. This transmission signal is transmitted to the antenna 7 via a waveguide, and is discharged to space.

The antenna 7 receives a reception wave reflected from the target. The reception wave that is output from the antenna 7 is input to the amplifier 38 via the reception terminal 36. The amplifier 38 performs low-noise amplification on the output from the antenna 7. The mixer 39 outputs a video signal having a sum of and a difference between the N-time frequency of the signal of the high-frequency signal input from the power distributor 32 and the output frequency of the amplifier 38, to the signal processing substrate 8. The signal processing substrate 8 analyzes the frequency of a fast Fourier transform (FFT) based on the video signal, and calculates a distance and a relative speed with respect to the target. The calculated distance and relative speed with respect to the target are transmitted to the external device.

The radar device 1 includes the transmission/reception module 6, the signal processing substrate 8, and a cable 13 including a power supply line and an input/output signal line to the signal processing substrate 8.

Figure 2:
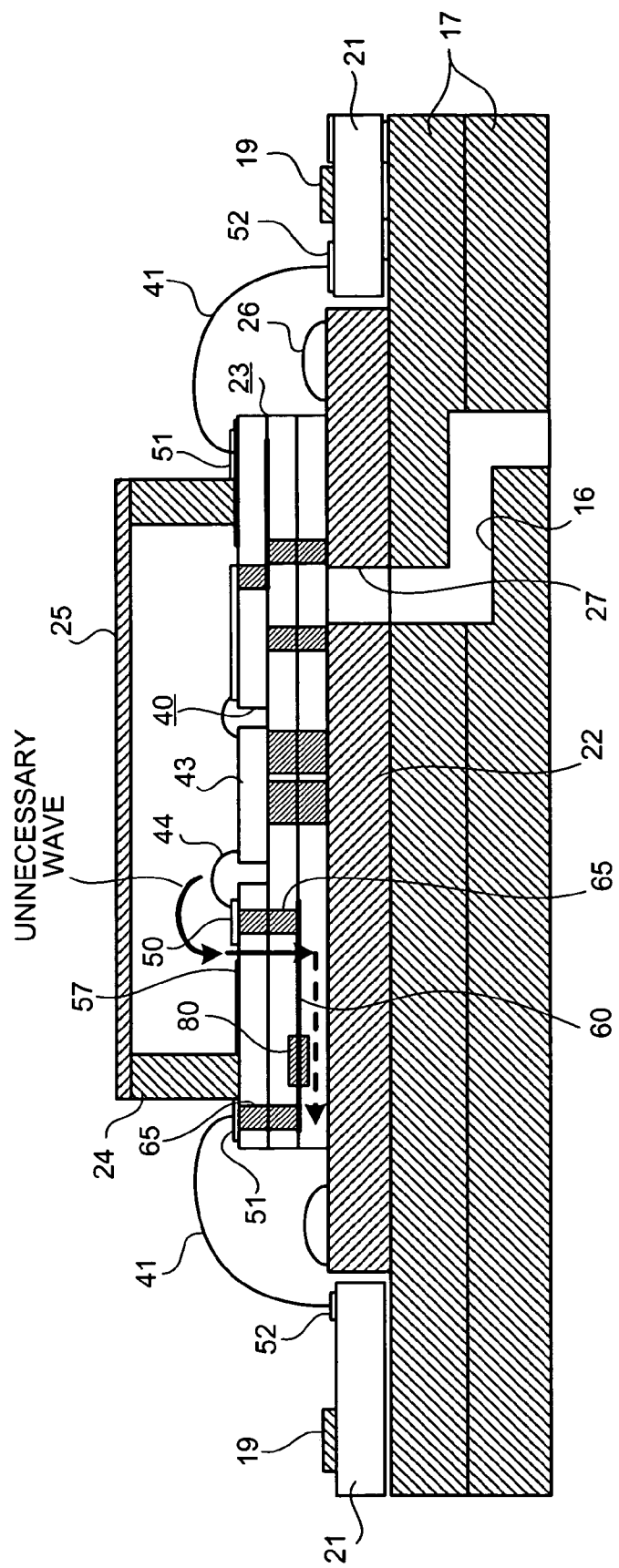
FIG. 2 is a cross-section of a configuration of a transmission/reception module.

FIG. 2 is a cross-section of the transmission/reception module 6. As shown in FIG. 2, the transmission/reception module 6 has a waveguide plate 17 formed with a waveguide 16 that is connected to the transmission terminal 35 and the reception terminal 36 shown in FIG. 1. The antenna 7 is connected to the lower surface of the waveguide plate 17. The transmission/reception module 6 also includes the high-frequency package 2 mounted on the upper surface of the waveguide plate 17, and a module control substrate (also called a control/interface substrate) 21 on which an electronic circuit 19 constituting the control circuit 3 or the modulation circuit 4 shown in FIG. 1 is mounted. In FIG. 2, a grounded metal carrier 22, a multilayer dielectric substrate 23, a seal ring 24, and a cover 25 are shown as elements that constitute the high-frequency package 2.

Figure 3:
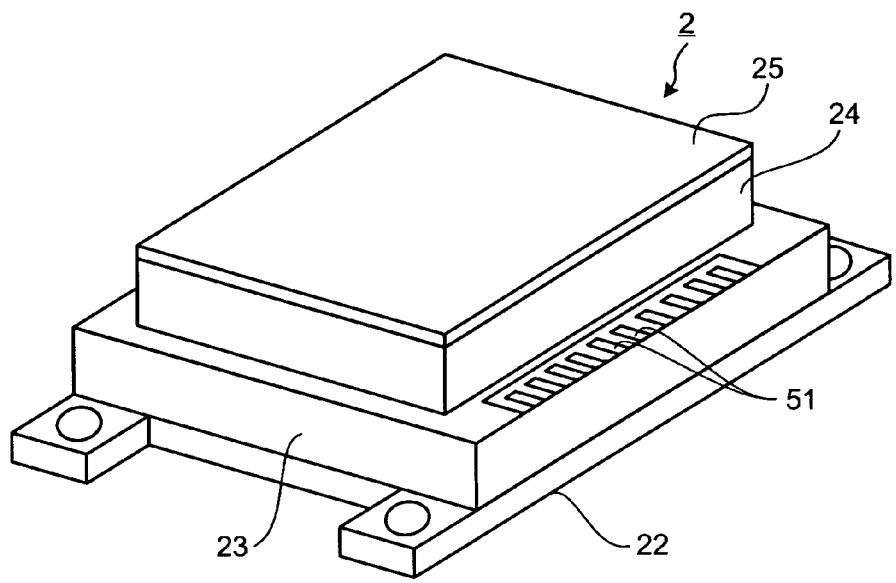
FIG. 3 is a perspective view of a high-frequency package according to a first embodiment of the present invention.
Figure 4:
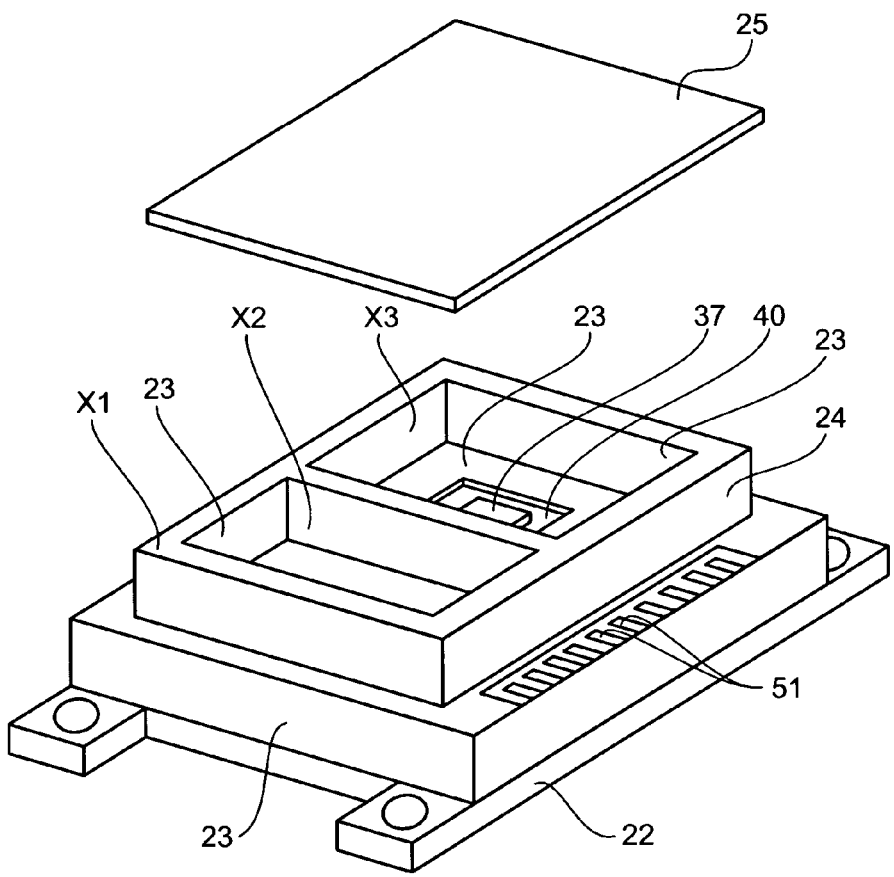
FIG. 4 is a perspective view of the high-frequency package according to the first embodiment when a cover is dismounted.

FIG. 3 is a perspective view of the high-frequency package 2, and FIG. 4 is a perspective view of the high-frequency package 2 with a cover dismounted. As shown in FIG. 3 and FIG. 4, a side surface of the multilayer dielectric substrate 23 has a staged shape, and external terminals 51 are formed on an upper surface of the stage. As shown in FIG. 4, a surface X1 on which the cover 25 is fit is formed on an upper surface of the multilayer dielectric substrate 23. Cavities X2 and X3 facing above are formed on an upper surface of the multilayer dielectric substrate 23. A smaller concave cavity 40 is provided within the cavities X2 and X3 respectively. An MMIC 37 is accommodated and mounted within the cavity 40.

FIG. 5 is a plan view of the high-frequency package 2 with the cover 25 dismounted. As shown in FIG. 2 and FIG. 5, the grounded metal carrier 22, and the module control substrate 21 mounted with the electronic circuit 19 constituting the control circuit 3 and the modulation circuit 4 are mounted on the waveguide plate 17 formed with the waveguide 16. A waveguide 27 is also formed in the carrier 22. The carrier 22 is fixed to the waveguide plate 17 by inserting a screw 26 into a screw hole 26a formed in a flange 28. The multilayer dielectric substrate 23 is mounted on the carrier 22. One or plural (two, in the present example) concaves, that is, the cavities 40, are formed at a center of the multilayer dielectric substrate 23.

Plural high-frequency semiconductors, that is, MMICs 43 included in the high-frequency package 2 shown in FIG. 1 are accommodated on a bottom surface (the upper surface) 41 of the cavity 40. The high-frequency semiconductor 43 herein is a generic name of the voltage control oscillator (VCO) 30, the power distributor 32, the multiplier 33, the amplifier 34, the low-noise amplifier (LNA) 38, and the mixer (MIX) 39 included in the high-frequency package 2 shown in FIG. 1.

As shown in FIG. 5, a reception system high-frequency semiconductor such as the low-noise amplifier (LNA) 38 and the mixer (MIX) 39 is accommodated in one of the cavities (the upper side in FIG. 5) 40, and a transmission system high-frequency semiconductor such as the voltage control oscillator (VCO) 30, the power distributor 32, the multiplier 33, and the amplifier 34 is accommodated in the other (the lower side in FIG. 5.) cavity 40.

The frame-shaped seal ring 24 made of metal that shields an unnecessary discharging from the high-frequency semiconductor 43 to outside is mounted on the multilayer dielectric substrate 23. The cover 25 is provided on the seal ring 24. The seal ring 24 and the cover 25 constitute an electromagnetic shielding member that covers a part of the surface layer of the multilayer dielectric substrate 23 and the high-frequency semiconductor 43.

As shown in FIG. 5, a feed-through 42 is provided in a seal ring 24' that partitions the two cavities 40. The mixer (MIX) 39 accommodated in the upper cavity 40 and the power distributor 32 accommodated in the lower cavity 40 are connected by the feed-through 42 and a microstrip line 45. The feed-through 42 covers a signal pin or a microstrip line with a dielectric material. With this arrangement, a high-frequency signal is transmitted between the two cavities 40 while holding each cavity 40 in an air-tight state. In FIG. 5, a reference numeral 56 denotes a microstrip-waveguide converter.

A conductor pad (hereinafter, "bias and control signal pad") 50 that supplies a bias voltage to the high-frequency semiconductor 43 or inputs and outputs a control signal to and from the high-frequency semiconductor 43 is provided on the multilayer dielectric substrate 23. A conductor pad (a bias and control signal terminal) 49 is also provided on the high-frequency semiconductor 43. The bias and control signal pad 50 is connected to the conductor pad 49 of the high-frequency semiconductor 43, and the high-frequency semiconductor 43 is connected to the microstrip line 45, respectively by wire bonding using a wire 44 made of metal or the like. Alternatively, these units can be connected to each other with a metal bump or a ribbon, in place of the wire 44.

The external terminals 51 are provided on the multilayer dielectric substrate 23 at the outside of the seal ring 24. As shown in FIG. 6, the external terminals 51 are electrically connected to the bias and control signal pad 50 provided on the multilayer dielectric substrate 23 inside the seal ring 24 via a signal via 65 (a signal through hole) formed in the multilayer dielectric substrate 23 and internal-layer signal lines 60. As shown in FIG. 2, these external terminals 51 are connected to an external terminal 52 formed on the module control substrate 21 via the wire 41. As shown in FIG. 2, a resistance film 80 is adhered to the internal-layer signal lines 60. The resistance film 80 suppresses leakage of a high-frequency component (unnecessary wave) to the outside via the internal-layer signal lines 60. The resistance film 80 is described in detail later.

FIG. 6 depicts, in detail, the via structure (through hole structure) inside the multilayer dielectric substrate 23 of the high-frequency package 2. In FIG. 6, the bias control signal via (hereinafter, "signal via") 65 is expressed in an outline, and a ground via 75 is expressed in a hatched line. In this example, the cavity 40 is formed on the multilayer dielectric substrate 23 by removing a center part of a first layer of the multilayer dielectric substrate 23. A ground surface 53 is formed as a surface-layer ground conductor on a bottom surface of the cavity 40, that is, on the surface of a third layer. The high-frequency semiconductor 43 is mounted on the ground surface 53 via a solder or a conductive adhesive 54. Plural ground vias 75a that connect between the ground surface 53 and the carrier 22 are provided on the ground surface 53 disposed beneath the high-frequency semiconductor 43.

In this case, the dielectric material is exposed on a sidewall 55 (a sidewall surface of the first layer of the multilayer dielectric substrate 23) of the cavity 40. One or plural bias and control signal pads 50 are provided on the surface layer (the upper surface layer) of the first layer of the multilayer dielectric substrate 23. Parts other than a part 56 at which the dielectric material is exposed around the bias and control signal pad 50 are formed with a ground pattern 57 as a surface-layer ground conductor, thereby preventing a high-frequency signal from entering inside the multilayer dielectric substrate 23 through the surface layer.

An RF shielding via 75b to shield a high-frequency component generated from the high-frequency semiconductor 43 is provided near a portion right under the seal ring 24 in the first layer of the multilayer dielectric substrate 23. Plural RF shielding vias 75b are also arranged in a direction perpendicular to the paper surface. An area from the sidewall 55 of the cavity 40 to where the RF shielding via 75b is provided in the first layer of the multilayer dielectric substrate 23 is called a cavity side edge 71. The ground pattern 57 provided on the surface layer of the cavity side edge 71 is called a side edge surface-layer ground pattern. The RF shielding via 75b is connected to the side edge surface-layer ground pattern 57 and an internal-layer ground conductor 70 that is formed on the internal layer of the multilayer dielectric substrate 23.

The bias and control signal pads 50 disposed inside the seal ring 24 are connected to the external terminals 51 disposed at the outside of the seal ring 24 via one or plural signal vias 65 and one or plural internal-layer signal lines 60. Plural ground vias 75c are disposed to sandwich a dielectric material around the signal via 65. These ground vias 75c shield electric fields from the signal vias 75.

While the internal-layer ground conductor 70 is shown in a simplified form in FIG. 6, the internal-layer ground conductor 70 is basically provided between all layers as a beta ground layer as shown in FIG. 7A to FIG. 7D and FIG. 8.

Figure 7A:
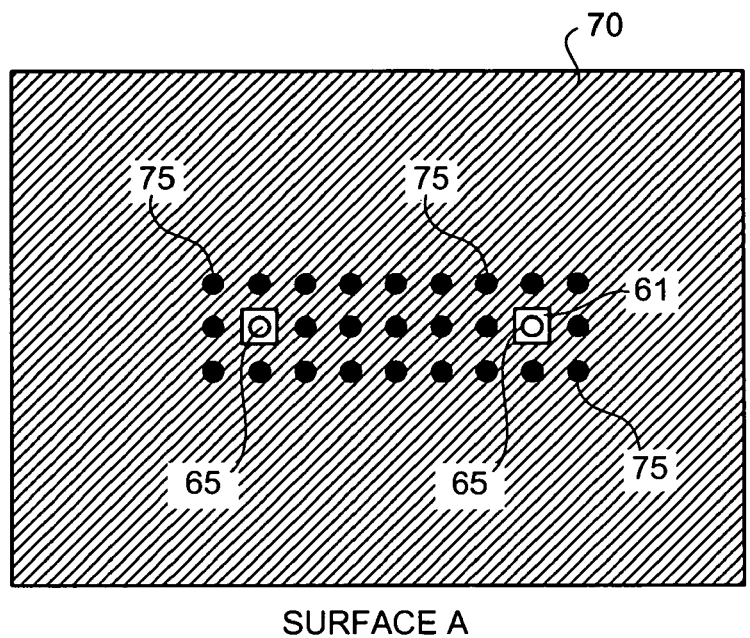
FIG. 7A is a schematic for illustrating a surface A of the multilayer dielectric substrate shown in FIG. 6.

FIG. 7A to FIG. 7D depict the surrounding of two signal vias 65 disposed at the left side in FIG. 6, between two layers. FIG. 7A (a surface A) depicts a state between a first layer and a second layer, FIG. 7B (a surface B) depicts a state between a third layer and a fourth layer, FIG. 7C (a surface C) depicts a state between the fourth layer and a fifth layer, and FIG. 7D (a surface D) depicts a state between the fifth layer and the carrier 22.

Figure 7B:
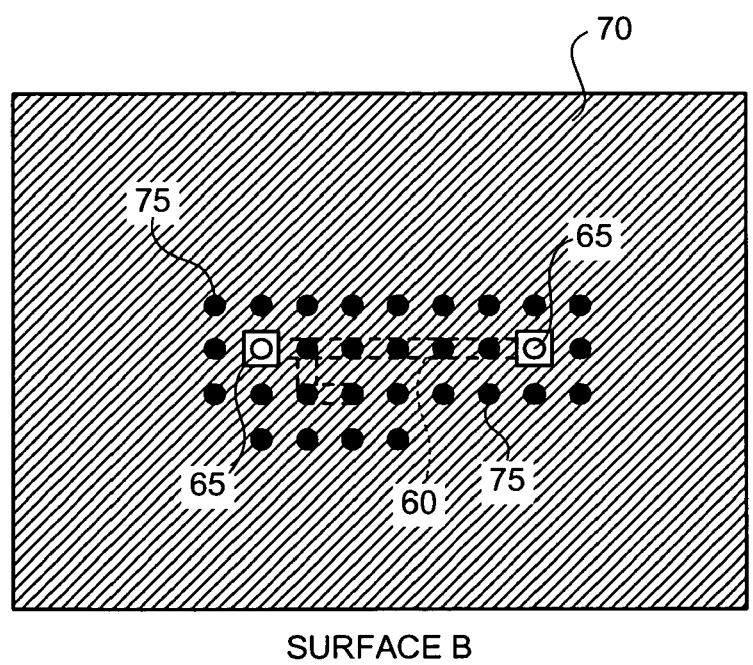
FIG. 7B is a schematic for illustrating a surface B of the multilayer dielectric substrate shown in FIG. 6.

On surfaces shown in FIG. 7A (the surface A) and FIG. 7B (the surface B), plural ground vias 75 and internal-layer ground conductors 70 are disposed around the two signal vias 65 through a dielectric material 61. On a surface in FIG. 7C (the surface C), two signal vias 65 and the internal-layer signal lines 60 that connect between the two signal vias 65 are disposed, and plural ground vias 75 and internal-layer ground conductors 70 are disposed around the signal vias 65 and the internal-layer signal lines 60 through the dielectric material 61. The resistance film 80 to suppress leakage of a high-frequency component to the outside is adhered to the internal-layer signal lines 60, and a slot line 83 is formed on the internal-layer signal lines 60. On a surface shown in FIG. 7D (the surface D), the signal vias 65 and the internal-layer signal lines 60 are not disposed, and only the ground via 75 and the internal-layer ground conductor. 70 are disposed.

Figure 8:
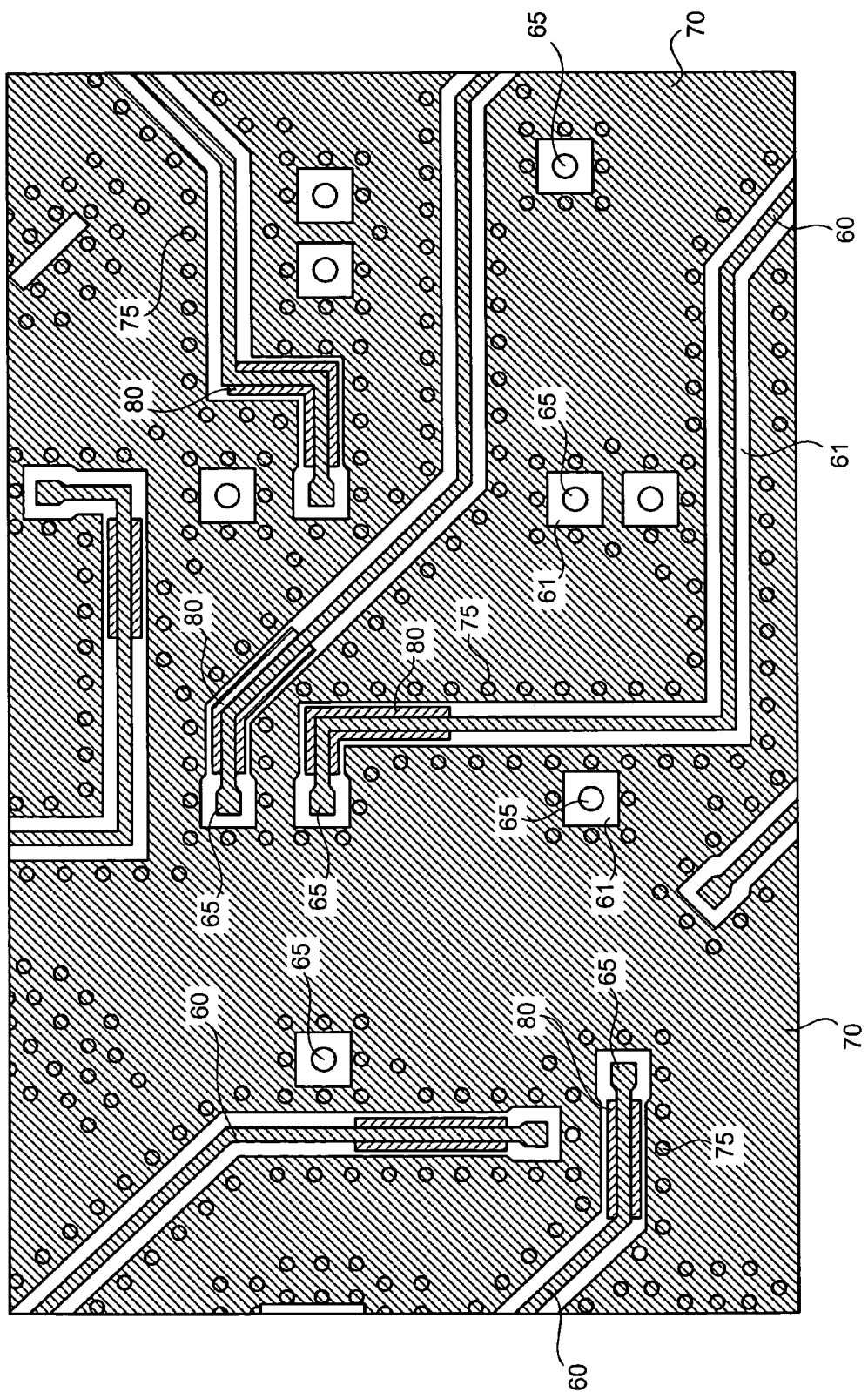
FIG. 8 is a plan view of a layout pattern of an internal-layer signal line, an internal-layer ground conductor, a ground via, and a signal via.

FIG. 8 depicts an example of a wiring pattern in an optional layer. As shown in FIG. 8, plural ground vias 75 and internal-layer ground conductors 70 are disposed around the signal vias 65 through the dielectric material 61. At a position where the internal-layer signal lines 60 are present, plural ground vias 75 and internal-layer ground conductors 70 are disposed around the internal-layer signal lines 60 connected to the signal vias 65 through the dielectric material 61. In the example shown in FIG. 8, the resistance film 80 to suppress leakage of a high-frequency component to the outside is also applied to the internal-layer signal lines 60.

The high-frequency package 2 shown in FIG. 2 to FIG. 8 has the following three characteristic structures (a) to (c).

(a) As shown in FIG. 2 and FIGS. 6 to 8, the resistance film 80 is provided on at least one of the upper surface and the lower surface of the internal-layer signal lines 60. With this arrangement, the resistive element absorbs, based on the skin effect, a high-frequency signal that enters via the sidewall 55 of the cavity 40 or the dielectric material 56 around the bias and control signal pad 50 and that is coupled to the signal vias 65 or the internal-layer signal lines 60. At the same time, a bias DC voltage or a low-to-intermediate frequency signal for a control signal can be transmitted without a voltage drop. Based on this configuration, the high-frequency signal can be suppressed from being discharged to outside of the high-frequency package 2 through the signal vias 65, the internal-layer signal lines 60, and the external terminals 51.

(b) A sidewall ground via string 82 is formed with plural ground vias (also called sidewall ground vias) 81 arranged in the direction along the sidewall 55 (a direction perpendicular to the paper surface of FIG. 6, hereinafter, "depth direction"), near the sidewall 55 of the cavity side edge 71. A distance between the sidewall ground via string 82 and an RF shielding via string 84 (a via string including RF shielding vias 75b at a shortest distance from the signal via) at a shortest distance by sandwiching the signal via 65 is set to less than a half of an effective wavelength $\lambda g$ of a high-frequency signal used in the high-frequency package 2. A distance between adjacent ground vias in each of the ground via strings 82 and 84 is also set to less than a half of the effective wavelength $\lambda g$. Based on this, entrance of a high-frequency signal to the sidewall 55 of the cavity 40 is suppressed, and passage of the high-frequency signal to the depth direction is suppressed. Consequently, a coupling of a high-frequency component within the cavity side edge 71 can be suppressed. Even when a high-frequency signal enters the multilayer dielectric substrate 23 via the dielectric material 56 around the bias and control signal pad 50 and the sidewall 55 of the cavity 40, the amount of the high-frequency signal transmitting to the depth direction becomes small. Therefore, the high-frequency signal can be suppressed from being coupled to the signal vias 65 or the internal-layer signal lines 60. As a result, the high-frequency signal can be suppressed from being discharged outside the high-frequency package 2 through the signal vias 65, the internal-layer signal lines 60, and the external terminals 51.

Figure 7C:
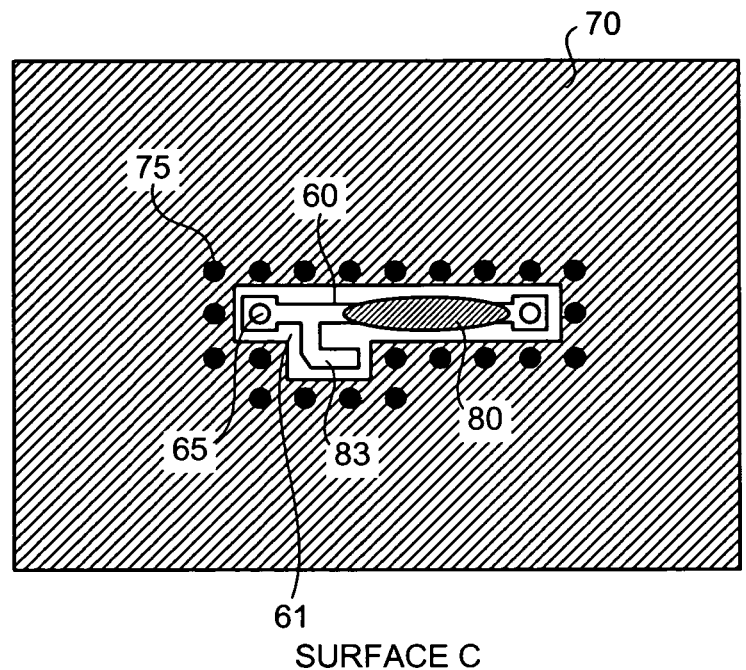
FIG. 7C is a schematic for illustrating a surface C of the multilayer dielectric substrate shown in FIG. 6.
Figure 7D:
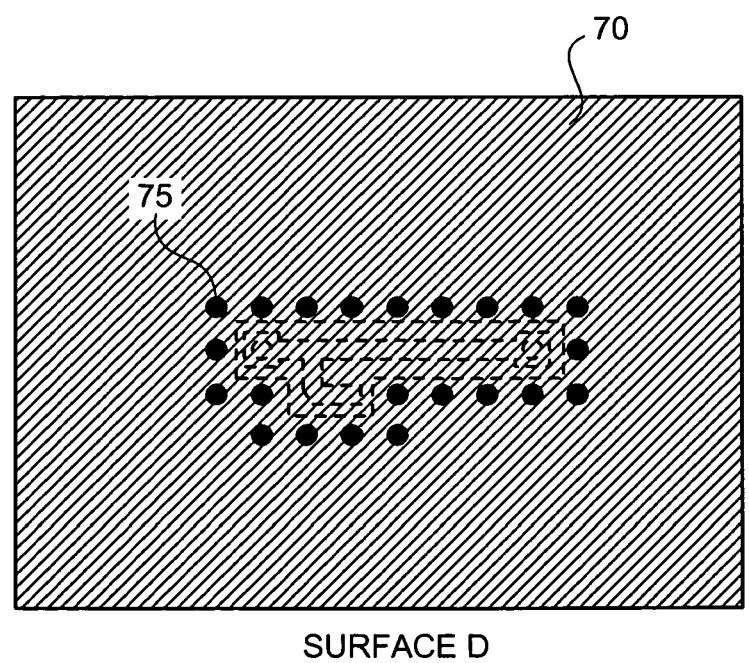
FIG. 7D is a schematic for illustrating a surface D of the multilayer dielectric substrate shown in FIG. 6.

(c) As shown in FIG. 6 and FIG. 7C, the slot line 83 having a length of a quarter ±10% of the effective wavelength $\lambda g$ of a high-frequency signal used in the high-frequency package 2 is provided in the internal-layer signal lines 60. By providing the slot line 83, a high-frequency signal that is coupled to the signal vias 65 or the internal-layer signal lines 60 via the sidewall 55 of the cavity 40 or the dielectric material 56 around the bias and control signal pad 50 can be reflected at the position of the slot line 83. Consequently, the high-frequency signal can be suppressed from transmitting to the front of the slot line 83. As a result, leakage of a high-frequency component to the outside via the external terminals 51 can be suppressed.

As explained above, the high-frequency package 2 has the characteristic structures (a) to (c), and can suppress a discharge of an unnecessary wave of the high-frequency package 2 to the outside.

The characteristic structure (a) as a key element of the present invention is explained in detail next. Within the multilayer dielectric substrate 23, a high-frequency component from the high-frequency semiconductor 43 enters via the dielectric material 56 around the bias and control signal pad 50 and the sidewall 55 of the cavity 40, and is electromagnetically coupled to the signal vias 65 or the internal-layer signal lines 60. The high-frequency component tries to leak out of the high-frequency package 2 via the internal-layer signal lines 60, the signal vias 65, and the external terminals 51.

However, in the high-frequency package 2 of the present invention, as shown in FIG. 6 to FIG. 8, the high-resistance resistance film 80 is applied and adhered to only the upper surface, only the lower surface, or on both surfaces of the internal-layer signal lines 60. Therefore, even when a high-frequency component is electromagnetically coupled to the signal vias 65 or the internal-layer signal lines 60, based on the skin effect, the high-frequency component flows through the resistance film 80 formed on the surface of the internal-layer signal lines 60. The resistance film 80 absorbs this high-frequency component. Consequently, the high-frequency component that enters the internal-layer signal lines 60 cannot transmit to an end of the resistance film 80. As a result, leakage of the high-frequency component to the outside of the package via the external terminals 51 can be suppressed. A bias DC voltage or a low to intermediate frequency signal for a control signal that needs to be passed through the internal-layer signal lines 60 does not flow through the resistance film 80 on the surface layer of the internal-layer signal lines 60. Therefore, the bias DC voltage or the low to intermediate frequency signal for a control signal can pass through the internal-layer signal lines 60 without a voltage drop.

As explained above, since the resistance film 80 is formed on the internal-layer signal lines 60, the high-frequency signal is absorbed by the resistance film 80 based on the skin effect, thereby suppressing a discharge level of the high-frequency signal in the high-frequency package as a single unit.

The resistance film 80 can be formed along the total length of the internal-layer signal lines 60, or can be adhered to a part of the internal-layer signal lines 60 such as a signal input side, a signal output side, or signal input and output sides, as shown in FIG. 8.

The signal input side means an area of the internal-layer signal lines 60 near the signal vias 65 connected to the bias and control signal pads 50 side. The signal output side means an area of the internal-layer signal lines 60 near the signal vias 65 connected to the external terminal 51 side. When the resistance film 80 is disposed at the signal input side, leakage of the high-frequency signal to the outside can be suppressed at the entrance, thereby suppressing a spread of the high-frequency signal to the package internal layer. When the resistance film 80 is disposed at the signal output side, leakage of the high-frequency signal to the outside can be suppressed at the exit, thereby securely suppressing leakage of the high-frequency signal. When the resistance film 80 is applied to a part of the internal-layer signal lines 60, a coating material can be reduced. Also, a complex work of carrying out a mask processing to prevent a short-circuiting between the coating material and the adjacent line, additionally coating the resist, and generating a wiring pattern by finely controlling the line interval, can be reduced.

Figure 9:
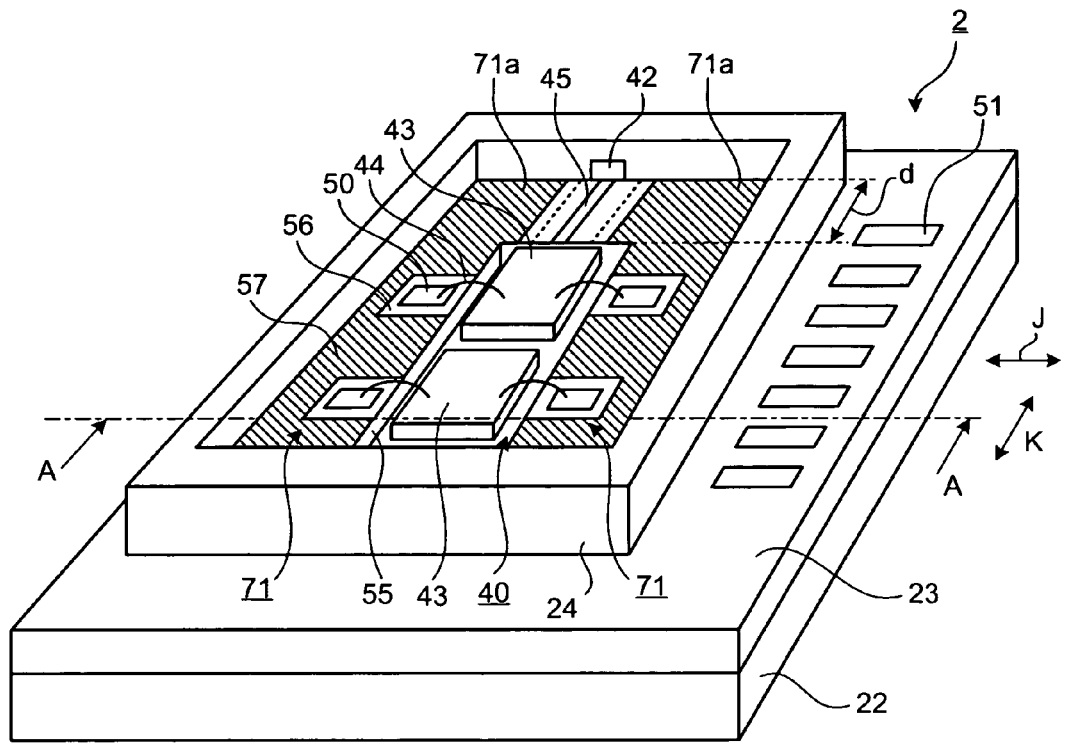
FIG. 9 is a perspective view of a simplified internal configuration of the high-frequency package.
Figure 10:
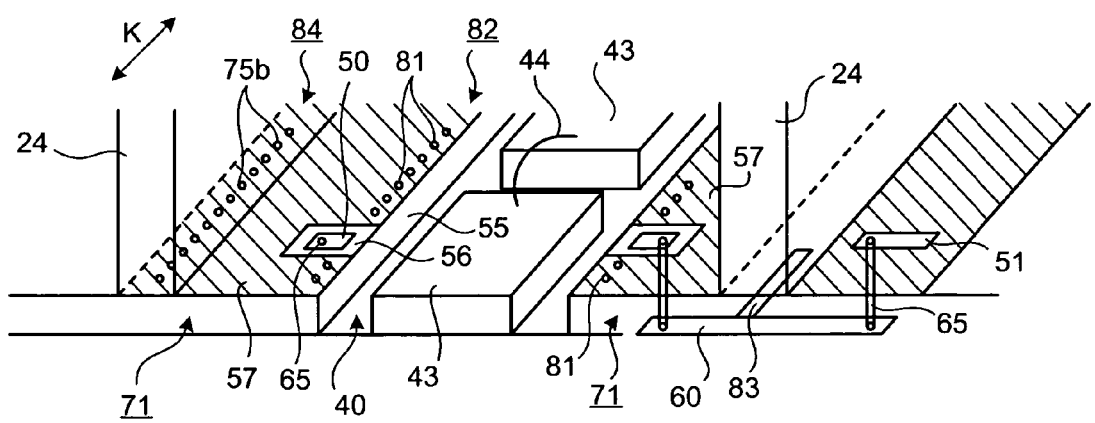
FIG. 10 is a partially enlarged view of FIG. 9.

The characteristic structures (b) and (c) as key elements of the present invention are explained in detail below with reference to FIG. 9 to FIG. 18. FIG. 9 depicts a simplified internal configuration of the high-frequency package 2 shown in FIG. 3 to FIG. 5. In FIG. 9, the high-frequency package 2 having one of the two cavities 40 shown in FIG. 4 and FIG. 5 is shown. FIG. 10 depicts the high-frequency package shown in FIG. 9 cut along a line A-A. In FIG. 9, the cover 25 is dismounted.

In FIG. 9, as described above, the high-frequency package 2 includes the grounded metal carrier 22, the multilayer dielectric substrate 23, the seal ring 24, the cavity 40, the feed-through 42, the high-frequency semiconductor 43, the wire 44, the microstrip line 45, the bias and control signal pad 50, the external terminals 51, the dielectric material 56 around the bias and control signal pad 50, and the ground 57 formed on the surface of the multilayer dielectric substrate 23.

The external terminals 51 are provided in the high-frequency package 2, and are electrically connected to the bias and control signal pad 50 via the signal vias 65 and the internal-layer signal lines 60. On the surface layer of the high-frequency package 2, in order to suppress a coupling of a high-frequency signal to a bias or a control signal, a ground pattern (only a side edge surface-layer ground pattern 57 is shown in FIG. 9) is provided on other than the microstrip line 45, the bias and control signal pad 50, and the dielectric material 56 around them. The side edge surface-layer ground pattern 57 is connected to the internal-layer ground conductor 70 (refer to FIG. 6) via the ground vias 81 and 75b. In the high-frequency package 2, the dielectric material of the multyilayer dielectric substrate 23 is exposed to the sidewall 55 of the cavity 40, as described above.

The high-frequency signal used in the high-frequency semiconductor 43 is connected to the microstrip line 45 with the wire 44, for example, and is transmitted to the high-frequency semiconductor 43 within the other cavity 40 with the feed-through 42 or the like. The bias and control signal to drive or control the high-frequency semiconductor 43 passes from the external terminal 51 to the bias and control signal pads 50 through the signal vias 65 and the internal-layer signal lines 60. The bias and control signal is applied to the high-frequency semiconductor 43 from the bias and control signal pads 50 via the wires 44. The ground patterns and the ground vias provided in the high-frequency package 2 suppress the high-frequency signal component discharged from the high-frequency semiconductor 43 or the microstrip line 45 to space from being coupled to the bias and control signal.

Figure 11:
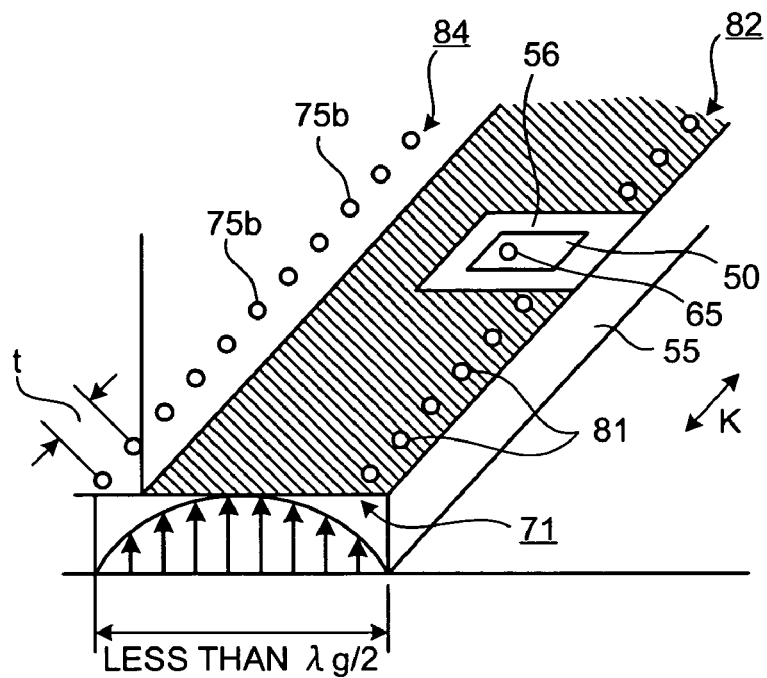
FIG. 11 is a partially enlarged view of FIG. 10.

The characteristic structure (b) is explained in detail next. As shown in FIG. 10 and FIG. 11, the sidewall ground via string 82 having plural sidewall ground vias 81 arranged in a depth direction K is provided near the sidewall 55 of the cavity 40 in the multilayer dielectric substrate 23. A distance between the sidewall ground via string 82 and the ground via string 84 consisting of plural ground vias 75b in a shortest distance from the sidewall ground via string 82 sandwiching the signal via 65 is set to less than a half of the effective wavelength λg of the high-frequency signal used within the high-frequency package-2. A distance t between adjacent ground vias in each of the ground via strings 82 and 84 is also set to less than a half of the effective wavelength λg.

Figure 12:
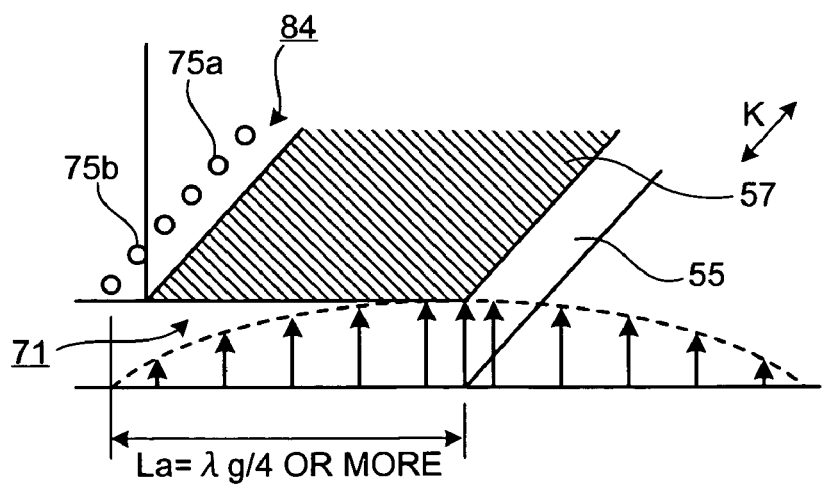
FIG. 12 is a schematic for illustrating a high-frequency package according to a conventional technique.

On the other hand, FIG. 12 depicts a configuration of a high-frequency package not provided with the sidewall ground via string 82 near the sidewall 55 forming the cavity 40. As shown in FIG. 12, when the sidewall ground via string 82 is not provided, the sidewall 55 operates as a high-frequency magnetic wall. Therefore, a magnetic field distribution having the magnetic wall as a symmetrical axis of a maximum electric field value is generated as shown in FIG. 12. When a distance from the sidewall 55 to the ground via string 84 is La, a wavelength component of a half-wave length equal to or less than 2La can pass to the depth direction K, and only a wavelength component of a half-wave length larger than 2La cannot pass to the depth direction K.

Therefore, when La≧λg/4 as shown in FIG. 12, the high-frequency component of the effective wavelength λg can pass to the depth direction K. Therefore, as shown in FIG. 12, when the sidewall ground via string 82 is not provided near the sidewall 55 and also when a distance from the sidewall 55 to the ground via string 84 is equal to or larger than a quarter of the effective wavelength λg, a high-frequency component that enters via the sidewall 55 or the dielectric material 56 around the bias and control signal pad 50 is coupled within the cavity side edge 71. The high-frequency component passes to the depth direction K, is coupled to the bias and control signal, and leaks via the signal vias 65, the internal-layer signal lines 60, and the external terminal 51.

However, in the configurations shown in FIG. 10 and FIG. 11, the distance t between adjacent ground vias in each of the ground via strings 82 and 84 is set to less than a half of the effective wavelength λg. With this arrangement, the adjacent ground vias 81 and 81 (or 75b and 75b) work as cutoff waveguides respectively, thereby suppressing the high-frequency component from entering from the sidewall 55.

In the configurations shown in FIG. 10 and FIG. 11, the distance between the sidewall ground via string 82 and the ground via string 84 is set to less than a half of the effective wavelength λg. Therefore, a part between the sidewall ground via string 82 and the ground via string 84 works as a cutoff waveguide, and this part has a transmission characteristic like that of a high-pass filter as shown by a curved line b in FIG. 13. Consequently, a transmission amount of a high-frequency component in the frequency area near a frequency f0 or a lower frequency area than the f0 can be decreased.

Figure 13:
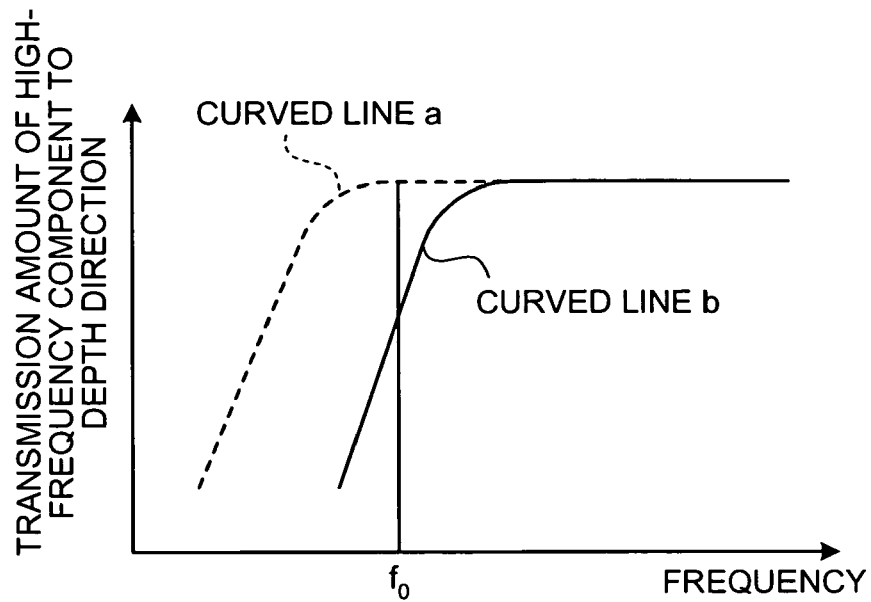
FIG. 13 is a characteristic plot of a high-frequency component to a depth direction.

FIG. 13 depicts a transmission characteristic of a high-frequency component to the depth direction K at the cavity side edge 71, when a distance between the sidewall ground via string 82 and the ground via string 84 is set to less than a half of the effective wavelength λg of the high-frequency signal, and when this distance is set to equal to or larger than a half of the effective wavelength λg, in the configuration shown in FIG. 11, and when the sidewall ground via string 82 is not provided and also when La≧λg/4, and when La<λg/4, in FIG. 12, respectively. A curved line a expressed by a broken line shows the transmission characteristic when a distance between the sidewall ground via string 82 and the ground via string 84 is set to equal to or larger than a half of the effective wavelength λg in the configuration shown in FIG. 11, or when the sidewall ground via string 82 is not disposed and also when La≧λg/4 as shown in FIG. 12. A curved line b expressed by a solid line shows the transmission characteristic when a distance between the sidewall ground via string 82 and the ground via string 84 is set to less than a half of the effective wavelength λg of the high-frequency signal in the configuration shown in FIG. 11, or when the sidewall ground via string 82 is not disposed and also when La<λg/4 as shown in FIG. 12 (configuration shown in FIG. 22).

In FIG. 13, f0 denotes a frequency corresponding to the effective wavelength λg of the high-frequency signal used within the high-frequency package 2. When a frequency of a transmission wave transmitted from the radar device 1 is 76 GHz, f0=76 GHz. As shown by the curved line a in FIG. 13, when the sidewall ground via string 82 is not disposed and also when La≧λg/4, or when the sidewall ground via string 82 is disposed but the distance between the sidewall ground via string 82 and the ground via string 84 is equal to or larger than a half of the effective wavelength λg as shown in FIG. 11, a transmission amount of a high-frequency signal to the depth direction K in the frequency f0 corresponding to the effective wavelength λg of the high-frequency signal is large.

However, as shown in FIG. 10 or FIG. 11, when the distance between the sidewall ground via string 82 and the ground via string 84 is less than a half of the effective wavelength λg of the high-frequency signal, the transmission characteristic in the depth direction K is like that of the high-pass filter as shown by the curved line b in FIG. 13 as explained above. Consequently, a transmission amount of a high-frequency component in the frequency area near the frequency f0 or a lower frequency area than the f0 can be decreased. Therefore, even when an unnecessary wave enters the multilayer dielectric substrate 23 via the dielectric material 56 around the bias and control signal pad 50 and the sidewall 55 of the cavity 40, the transmission amount in the depth direction at the cavity side edge 71 becomes small. Therefore, the coupling of the high-frequency signal to the signal vias 65 or the internal-layer signal lines 60 can be suppressed. Consequently, the unnecessary wave can be suppressed from being discharged outside the high-frequency package 2 via the signal vias 65, the internal-layer signal lines 60, and the external terminal 51. FIG. 11 depicts an electric field distribution when the sidewall ground via string 82 is disposed.

In many cases, this type of radar device generates a transmission signal by multiplying an oscillation signal. Therefore, when a transmission frequency is 76 GHz, frequency components of 38 GHz, 19 GHz, and the like are present in a mixture. These frequency components can be suppressed from being coupled to the signal vias 65 or the internal-layer signal lines 60.

As shown in FIG. 11, while the dielectric material 56 is exposed around the bias and control signal pad 50, the side edge surface-layer ground pattern 57 and the sidewall ground vias 81 are not formed at a part near the sidewall 55 of the exposed part. This is because when the side edge surface-layer ground pattern 57 and the sidewall ground vias 81 are formed at this part, the wire 44 may erroneously contact the ground at the time of wire boding the wire 44 to the bias and control signal pad 50. When this point is not considered, it is of course preferable to cover the whole surrounding of the bias and control signal pad 50 with the side edge surface-layer ground pattern 57 and to provide the sidewall ground vias 81, from the viewpoint of suppressing leakage of a high-frequency component to the outside.

In the high-frequency package 2 shown in FIG. 9, the microstrip line 45 extending to the depth direction K is provided. Therefore, it is necessary to suppress the passage of the high-frequency component to a direction J perpendicular to the depth direction K, at cavity side edges 71a positioned at both sides of the microstrip line 45. In this case, ground via strings 74 are formed at both sides of the microstrip line 45, thereby suppressing leakage of the high-frequency component to the direction J. Therefore, a length d in the direction K of the cavity side edges 71a does not need to be particularly prescribed by the effective wavelength λg.

(First Modification of the Characteristic Structure (b))

Figure 14:
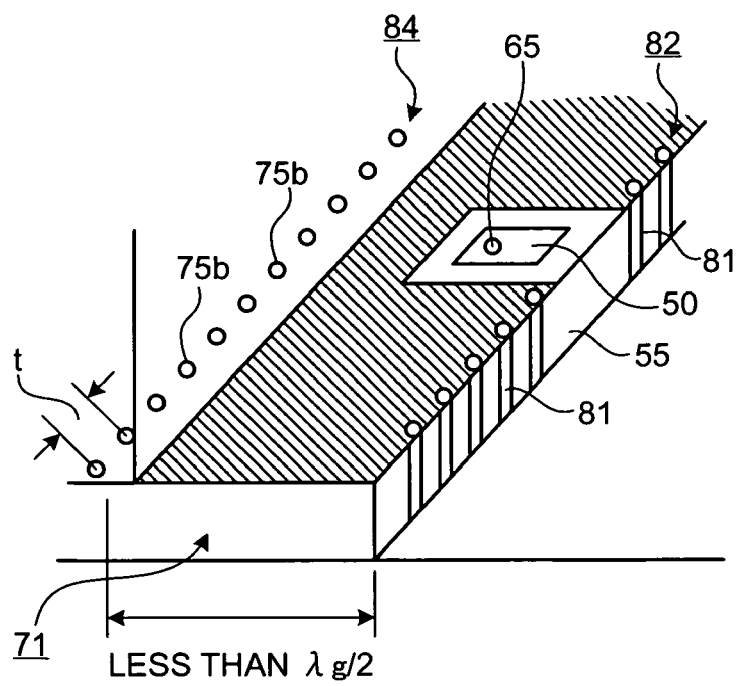
FIG. 14 is a perspective view of a modification of the high-frequency package according to the first embodiment.

FIG. 14 depicts a first modification of the high-frequency package shown in FIG. 11. In FIG. 14, plural sidewall ground vias 81 have shapes half cut perpendicularly, and are disposed in contact with the sidewall 55 that constitutes the cavity 40.

In the configuration shown in FIG. 14, a distance between the sidewall ground via string 82 consisting of plural sidewall ground vias 81 and the ground via string 84 is also set to less than a half of the effective wavelength λg, and the distance t between the adjacent ground vias in each of the ground via strings 82 and 84 is also set to less than a half of the effective wavelength λg. Therefore, in the configuration shown in FIG. 14, the entrance of an unnecessary wave to the sidewall 55 of the cavity 40 can be also suppressed, and the passage of the unnecessary wave to the depth direction K can be also suppressed. Therefore, even when the unnecessary wave enters the cavity side edge 71 via the dielectric material 56 around the bias and control signal pad 50 and the sidewall 55 of the cavity 40, the high-frequency signal can be suppressed from being coupled to the signal via 65 or the internal-layer signal line 60. Consequently, the unnecessary wave can be suppressed from being discharged to outside the high-frequency package 2 via the signal via 65, the internal-layer signal line 60, and the external terminal 51.

(Second Modification of the Characteristic Structure (b))

Figure 15:
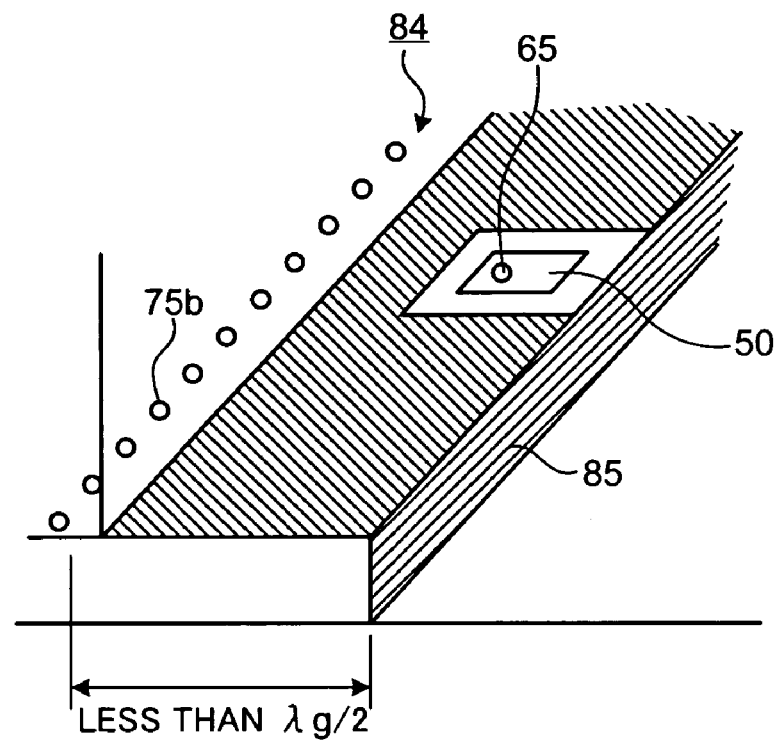
FIG. 15 is a perspective view of another modification of the high-frequency package according to the first embodiment.

FIG. 15 depicts a second modification of the high-frequency package shown in FIG. 10. In the configuration shown in FIG. 15, the whole surface of the sidewall 55 constituting the cavity 40 is metalized with the ground pattern 85. A distance between the ground pattern 85 and the ground via string 84 is set to less than a half of the effective wavelength λg, and the distance t between the adjacent ground vias in the ground via string 84 is set to less than a half of the effective wavelength λg. Therefore, in the configuration shown in FIG. 15, the entrance of an unnecessary wave to the sidewall 55 of the cavity 40 can be completely suppressed. Even when the unnecessary wave enters the multilayer dielectric substrate 23 via the dielectric material 56 around the bias and control signal pad 50, the high-frequency signal can be suppressed from being coupled to the signal via 65 or the internal-layer signal line 60. Consequently, the unnecessary wave can be suppressed from being discharged to outside the high-frequency package 2 via the signal via 65, the internal-layer signal line 60, and the external terminal 51.

Figure 16:
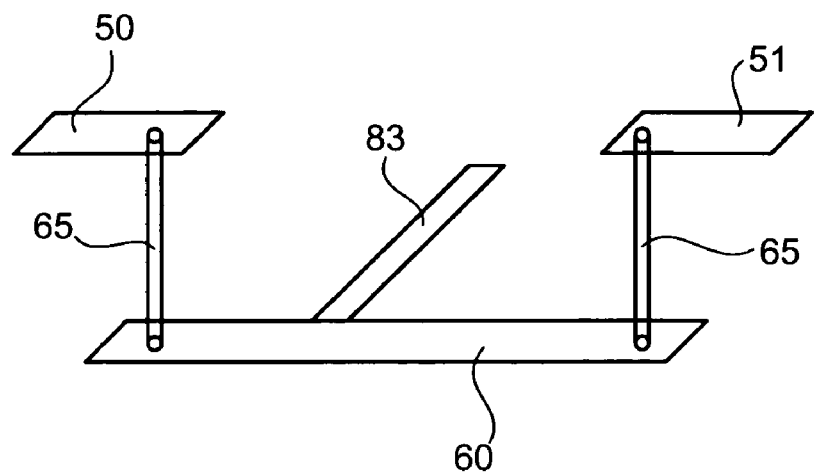
FIG. 16 is a partially enlarged view of FIG. 10.

The characteristic structure (c) is explained in detail next. As shown in FIG. 10 and FIG. 16, the slot line 83 having a length of a quarter ±10% of the effective wavelength λg is provided in the internal-layer signal line 60 connected to the bias and control signal pad 50. By providing the slot line 83, a high-frequency component that is coupled to the signal via 65 or the internal-layer signal lines 60 via the sidewall 55 of the cavity 40 or the dielectric material 56 around the bias and control signal pad 50 can be suppressed from transmitting to the internal-layer signal line 60 at the front of the slot line 83. Consequently, leakage of the high-frequency component to the outside via the external terminals 51 can be suppressed.

Figure 17:
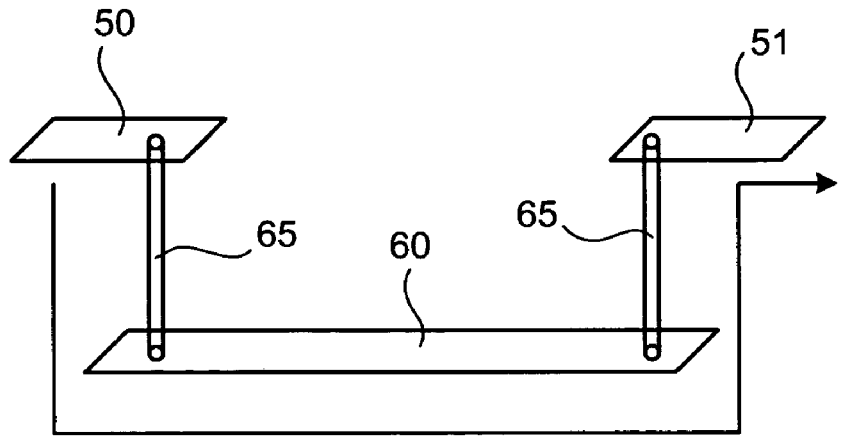
FIG. 17 is a schematic of the high-frequency package according to the conventional technique.

On the other hand, as shown in FIG. 17, when the slot line 83 is not provided in the internal-layer signal line 60, a high-frequency component coupled to the signal via 65 or the internal-layer signal line 60 passes through the internal-layer signal line 60, and leaks to the outside from the external terminals 51.

Figure 18:
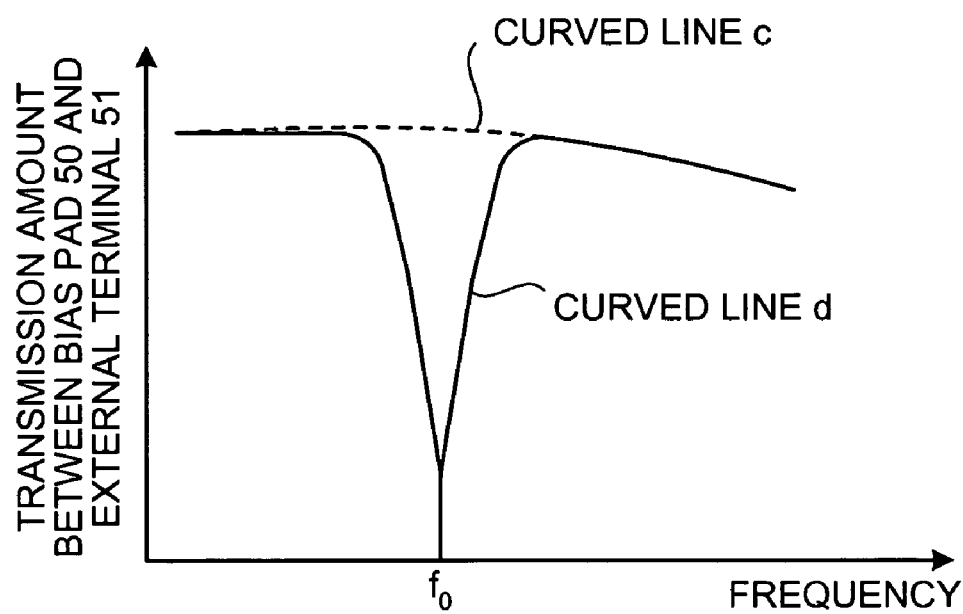
FIG. 18 is a characteristic plot of transmission of a high-frequency component between a bias pad and an external terminal.

FIG. 18 depicts a transmission characteristic of a high-frequency component between the bias and control signal pad 50 and the external terminal 51. A curved line c shows the transmission characteristic when the slot line 83 is not provided as shown in FIG. 17, and a curved line d shows the transmission characteristic when the slot line 83 having a length of a quarter ±10% of the effective wavelength λg is provided as shown in FIG. 16. As is clear from the curved line c shown in FIG. 18, when the slot line 83 is not provided, the transmission amount of the high-frequency component increases over the total frequency band. Therefore, when a high-frequency component is coupled to the signal via 65 or the internal-layer signal line 60, the high-frequency component leaks outside.

On the other hand, when the slot line 83 having a length of a quarter ±10% of the effective wavelength λg is provided, as is clear from the curved line d shown in FIG. 18, the function of a band stop filter works, and the transmission amount of the high-frequency component can be decreased extremely in the near band of the frequency f0 corresponding to the effective wavelength λg of the high-frequency signal. Therefore, a high-frequency component that is coupled to the signal via 65 or the internal-layer signal line 60 can be suppressed from transmitting to the internal-layer signal line 60 at the front of the slot line 83. Consequently, leakage of the high-frequency component to the outside can be suppressed.

As explained above, according to the first embodiment, since the characteristic structures (a) to (c) are provided, a high-frequency component can be shielded within the high-frequency package 2. Accordingly, leakage of the high-frequency component outside the high-frequency package can be suppressed. Consequently, a high-frequency package, a transmission/reception module, and a radio device having the high-frequency shielding performance can be provided at low cost.

According to the first embodiment, the present invention is applied to the high-frequency package 2 having the high-frequency semiconductor 43 accommodated within the cavity 40 formed in the multilayer dielectric substrate 23. The characteristic structures (a) to (c) can be also applied to the high-frequency package 2 having the high-frequency semiconductor 43 mounted on the surface layer of the multilayer dielectric substrate 23 having no cavity 40.

Second Embodiment

Figure 19:
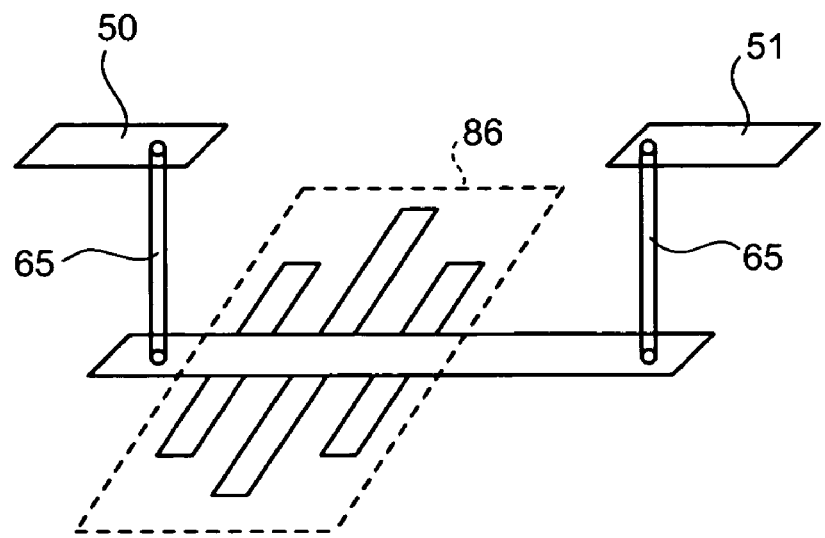
FIG. 19 is a partially enlarged view of a high-frequency package according to a second embodiment of the present invention.
Figure 20:
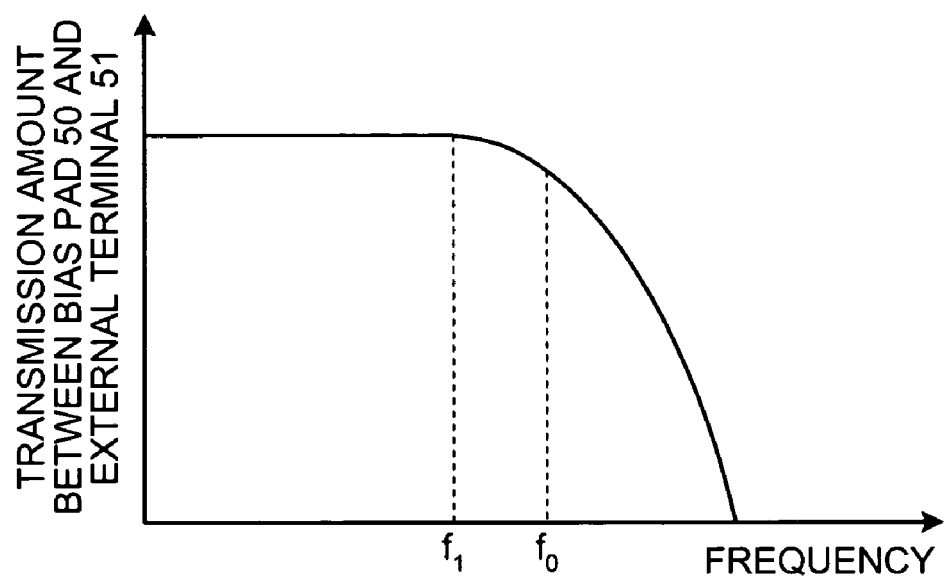
FIG. 20 is a characteristic plot of transmission an LPF according to the second embodiment.

A second embodiment of the present invention is explained below with reference to FIG. 19. In the second embodiment, the slot line 83 used in the first embodiment is changed to a low-pass filter 86 including a combination of plural slot lines. FIG. 20 depicts a transmission characteristic of the low-pass filter 86. This low-pass filter 86 cuts a frequency component equal to or higher than a predetermined frequency f1 lower than the frequency f0 corresponding to the effective wavelength λg of the high-frequency signal. The low-pass filter 86 is effective when many wavelength components near the effective wavelength λg are present.

According to the second embodiment, the low-pass filter 86 is provided in the internal-layer signal line 60. Consequently, the high-frequency component coupled to the signal via 65 or the internal-layer signal line 60 can be suppressed from transmitting to the internal-layer signal line 60 in front of the low-pass filter 86. As a result, leakage of a high-frequency component to the outside can be suppressed.

Third Embodiment

Figure 21:
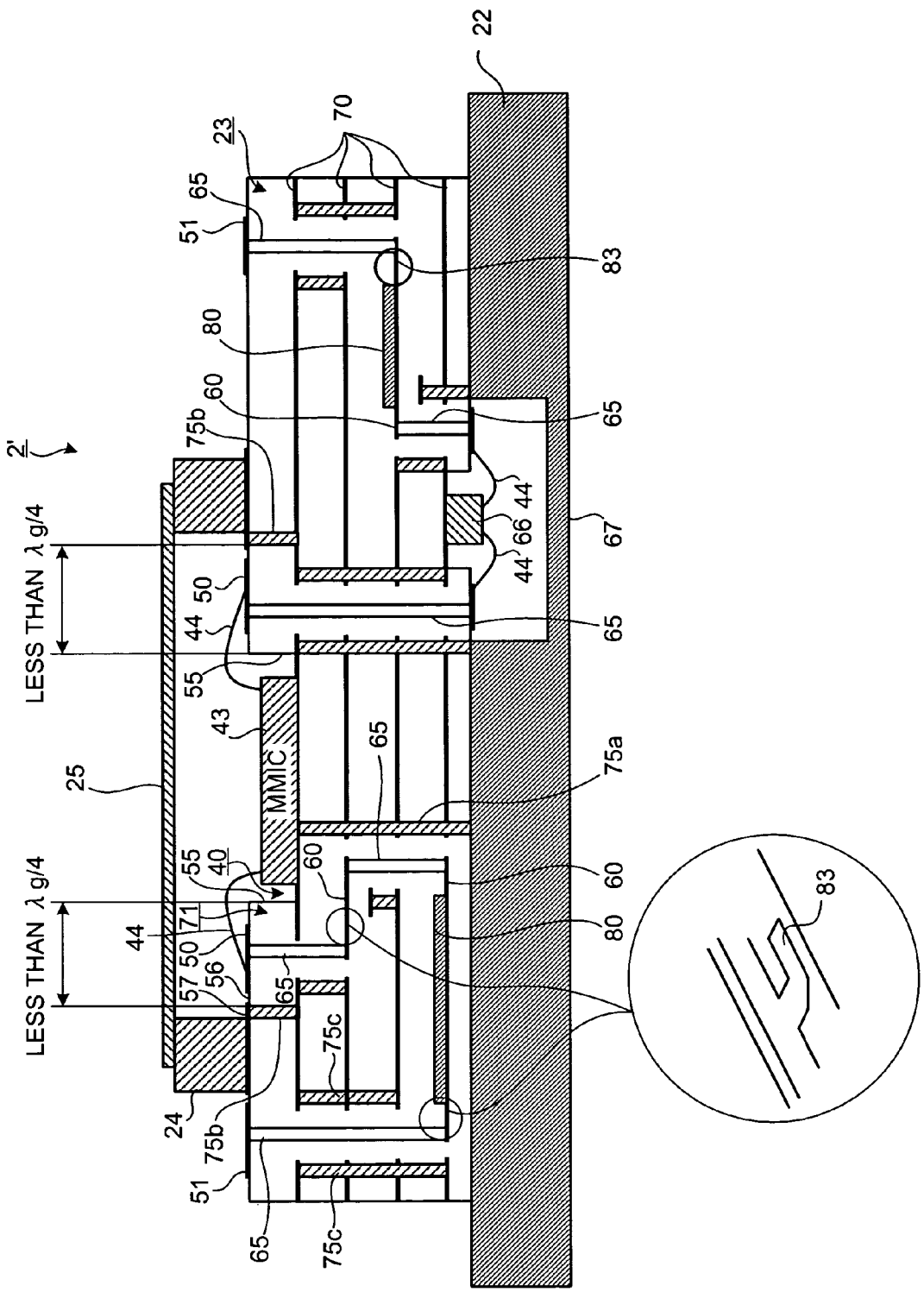
FIG. 21 is a cross-section of a high-frequency package according to a third embodiment of the present invention.
Figure 22:
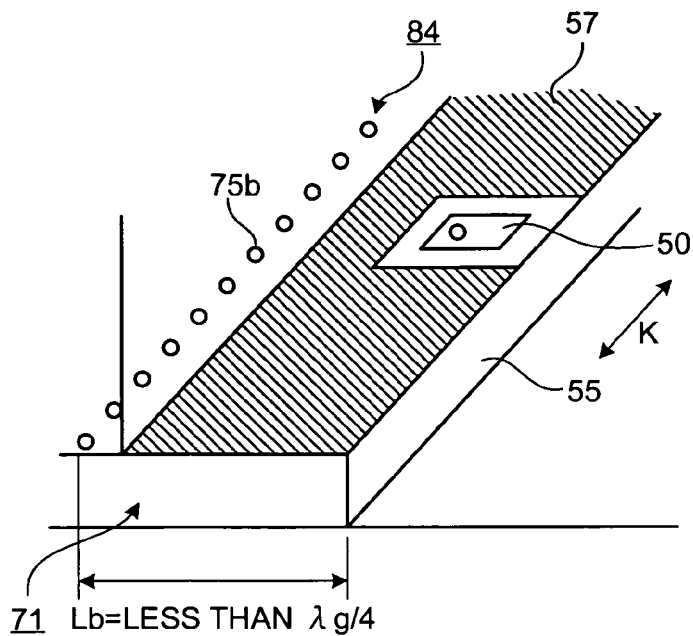
FIG. 22 is a partially enlarged view of the high-frequency package according to the third embodiment.

A third embodiment of the present invention is explained below with reference to FIG. 21 and FIG. 22. FIG. 21 depicts a high-frequency package 2' according to the third embodiment. In the high-frequency package 2', like reference numerals denote like constituent elements that achieve the same functions as the constituent elements of the high-frequency package 2 shown in FIG. 6, and a redundant explanation is omitted.

The high-frequency package 2' shown in FIG. 21 is double-side mounted. A high-frequency semiconductor (or an electronic circuit part concerning the high-frequency semiconductor) 66 is also mounted on a rear surface of the multilayer dielectric substrate 23. The high-frequency semiconductor 66 is shielded by the carrier 22 and a back-surface cover 67.

In the high-frequency package 2' according to the third embodiment, the sidewall ground vias 81 shown in FIG. 11 or the ground pattern 85 shown in FIG. 15 is not provided near the sidewall 55 that constitutes the cavity 40. The sidewall 55 is in a non-grounded state, with the dielectric material exposed. In the high-frequency package 2' according to the third embodiment, a distance between the sidewall 55 and the ground via string 84 consisting of plural ground vias 75b in a shortest distance from the sidewall 55 sandwiching the signal via 65 is set to less than a quarter of the effective wavelength λg of the high-frequency signal used within the high-frequency package 2.

Based on this configuration, the sidewall 55 works as a magnetic wall like that shown in FIG. 12, and has an electric field distribution similar to that shown in FIG. 12. However, with this configuration, a distance Lb between the sidewall 55 and the ground via string 84 is set to less than a quarter of the effective wavelength λg. Therefore, a high-frequency component of the effective wavelength λg cannot pass to the depth direction K. In other words, a high-frequency signal of the effective wavelength λg is cut off in the depth direction K, as shown in FIG. 13.

In the high-frequency package 2', the resistance film 80, which absorbs the high-frequency signal based on the skin effect, is formed on the internal-layer signal lines 60, thereby suppressing a discharge level of the high-frequency signal in the high-frequency package as a single unit.

As explained above, according to the third embodiment, while a high-frequency signal can enter the multilayer dielectric substrate 23 via the sidewall 55, the high-frequency signal can be suppressed from transmitting to the depth direction K. Therefore, the high-frequency signal can be suppressed from being coupled to the signal vias 65 or the internal-layer signal lines 60. As a result, an unnecessary wave can be suppressed from being discharged to outside the high-frequency package 2 through the signal vias 65, the internal-layer signal lines 60, and the external terminals 51. Since the resistance film 80 is formed on the internal-layer signal lines 60, the high-frequency signal can be suppressed from being discharged to outside the high-frequency package 2 through the external terminals 51.

Fourth Embodiment

Figure 23:
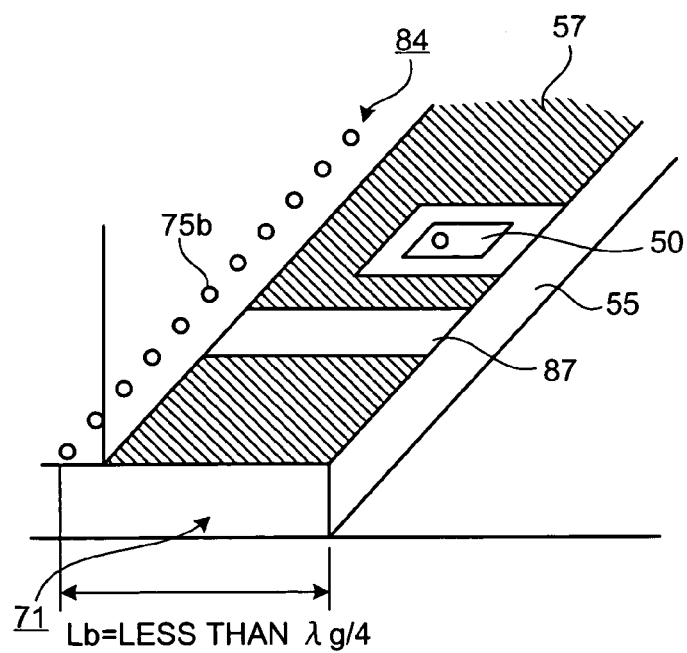
FIG. 23 is a partially enlarged view of a high-frequency package according to a fourth embodiment of the present invention.

A fourth embodiment of the present invention is explained below with reference to FIG. 23. The fourth embodiment is a modification of the third embodiment. The difference between the fourth embodiment and the third embodiment lies in that a part of the side edge surface-layer ground pattern 57 formed on the upper surface of the cavity side edge 71 of the multilayer dielectric substrate 23 is extracted, and a dielectric material is exposed at a ground-extracted part 87. The distance Lb between the sidewall 55, on which the dielectric material is exposed, and the ground via string 84 is set to less than a quarter of the effective wavelength λg.

Since the ground-extracted part 87 is provided, a high-frequency component that is coupled inside the cavity side edge 71 can be discharged to the internal space encircled by the seal ring 24 and the cover 25 via the ground-extracted part 87. In other words, in this case, the high-frequency component that enters the inside of the cavity side edge 71 is extracted to the above via the ground-extracted part 87. As explained above, according to the fourth embodiment, a high-frequency component that is coupled inside the cavity side edge 71 can be discharged to the internal space. Therefore, a coupling of the high-frequency component to the bias or control signal can be further decreased. Consequently, an unnecessary wave can be suppressed from being discharged outside the high-frequency package.

The ground-extracted part 87 can be also provided in the cavity side edge 71 of the high-frequency package 2 according to the first embodiment.

Fifth Embodiment

A fifth embodiment of the present invention is explained below with reference to FIG. 24 and FIGS. 25A to 25D. In the fifth embodiment, the characteristic structure (b) explained in the first embodiment is applied to a high-frequency package 91 mounted with a flip-chip high-frequency semiconductor (MMIC) 90.

Figure 25A:
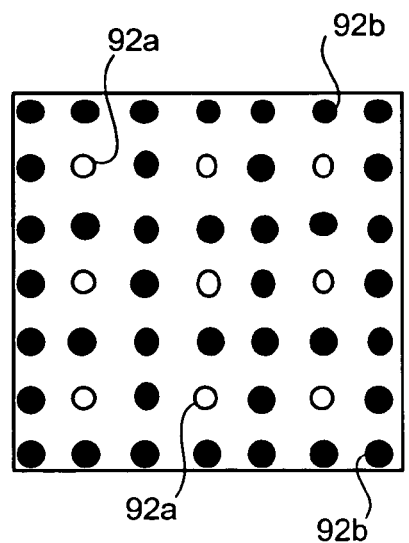
FIG. 25A is a schematic of a rear surface of a high-frequency semiconductor that is mounted on the high-frequency package according to the fifth embodiment.

The flip-chip high-frequency semiconductor 90 shown in FIG. 24 has many bumps 92 on its bottom surface. The high-frequency semiconductor 90 is connected to the multilayer dielectric substrate 23 via these bumps 92. FIG. 25A depicts the back surface of the high-frequency semiconductor 90, that is, a layout example of the bumps 92. In this case, ground bumps 92*b* expressed in black color are disposed around signal bumps 92*a* expressed in outline.

The multilayer dielectric substrate 23 is formed on the grounded carrier 22. The seal ring 24 and the cover 25 are formed on the multilayer dielectric substrate 23. The high-frequency semiconductor 90 is shielded with the seal ring 24 and the cover 25. The high-frequency semiconductor 90 is mounted by flip-chip bonding on a conductor pad 94 provided on the upper layer of the multilayer dielectric substrate 23. A surface-layer ground conductor 93, the internal-layer ground conductor 70, and the internal-layer signal line 60 are suitably formed on each layer of the multilayer dielectric substrate 23, in a similar manner to that of the high-frequency package 2 shown in FIG. 6 according to the first embodiment. The internal-layer ground conductor 70, the surface-layer ground conductor 93, and the carrier 22 are connected to each other with the ground vias 75. The signal bumps 92*a* and the external terminal 51 are connected to each other with the signal vias 65 and the internal-layer signal lines 60.

Figure 25B:
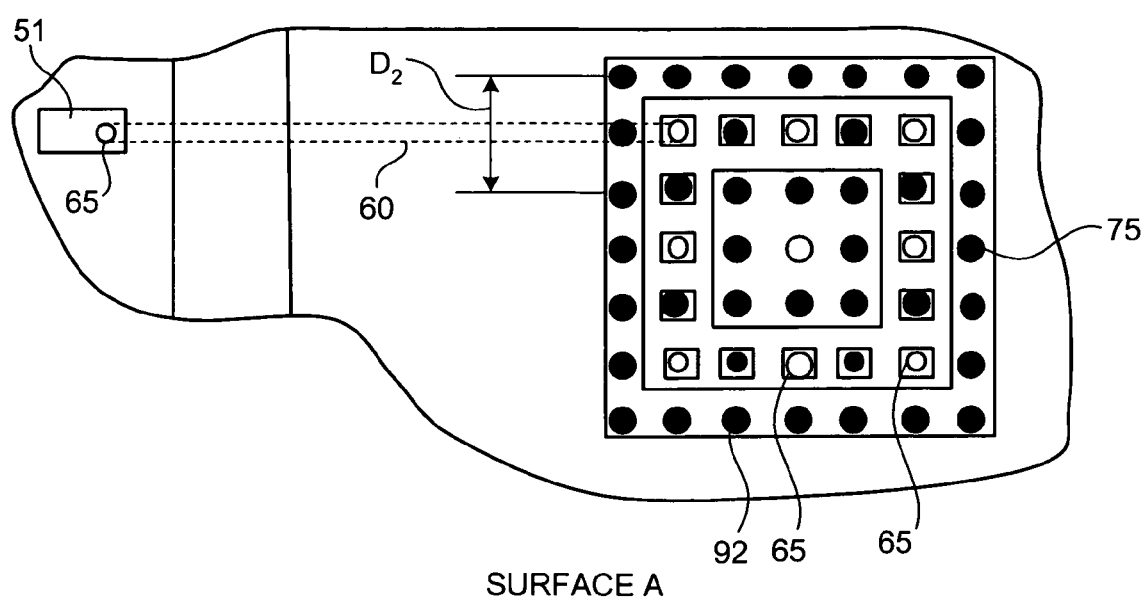
FIG. 25B is a schematic of a surface A of a multilayer dielectric substrate shown in FIG. 24.
Figure 25C:
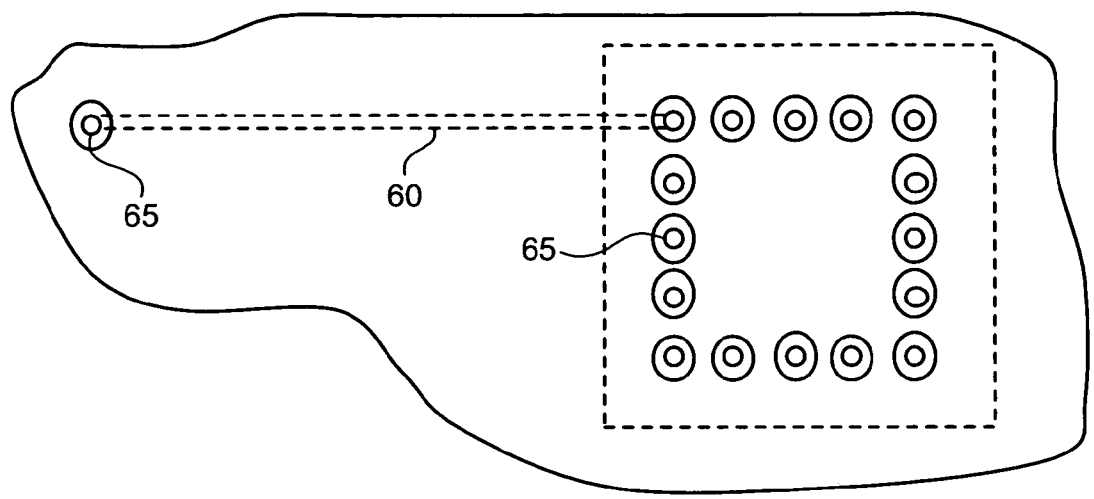
FIG. 25C is a schematic of a surface B of the multilayer dielectric substrate shown in FIG. 24.
Figure 25D:
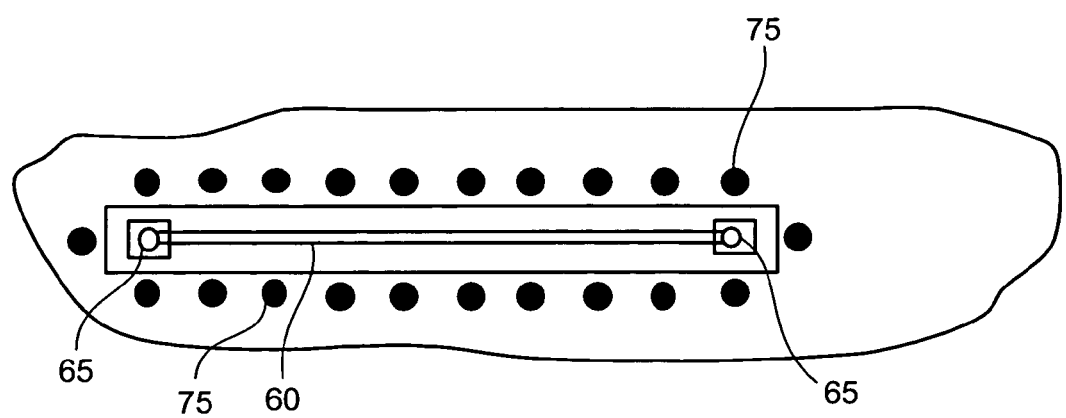
FIG. 25D is a schematic of a surface C of the multilayer dielectric substrate shown in FIG. 24.

FIG. 25B (the surface A) depicts a part of a via structure on the first-layer surface layer immediately below the high-frequency semiconductor 90. The signal vias 65 and the ground vias 75 are disposed corresponding to the layout of the signal bumps 92*a* and the ground bumps 92*b*. FIG. 25C (the surface B) depicts a part of a via structure on the second-layer surface layer immediately below the high-frequency semiconductor 90. FIG. 25D (the surface C) depicts a part of a via structure on the third-layer surface layer immediately below the high-frequency semiconductor 90. The internal-layer signal line 60 is formed on the third-layer surface layer shown as the surface C.

In mounting the high-frequency semiconductor 90, distances D1 and D2 between the ground vias 75 (the ground via string) that sandwich the signal vias 65 are set to less than a half of the effective wavelength λg of the high-frequency semiconductor 90 mounted on the high-frequency package 91, as shown in FIG. 24 and FIG. 25B.

With this arrangement, according to the fifth embodiment, the coupling of the high-frequency component to the signal vias 65 and the internal-layer signal lines 60 can be suppressed. Consequently, a high-frequency component can be suppressed from being discharged to outside the high-frequency package 2 via the signal vias 65, the internal-layer signal lines 60, and the external terminal 51.

Sixth Embodiment

A sixth embodiment of the present invention is explained below with reference to FIG. 26. In the sixth embodiment, the characteristic structure (a) explained in the first embodiment is applied to the high-frequency package 91 provided with the flip-chip high-frequency semiconductor (MMIC) 90.

Figure 26:
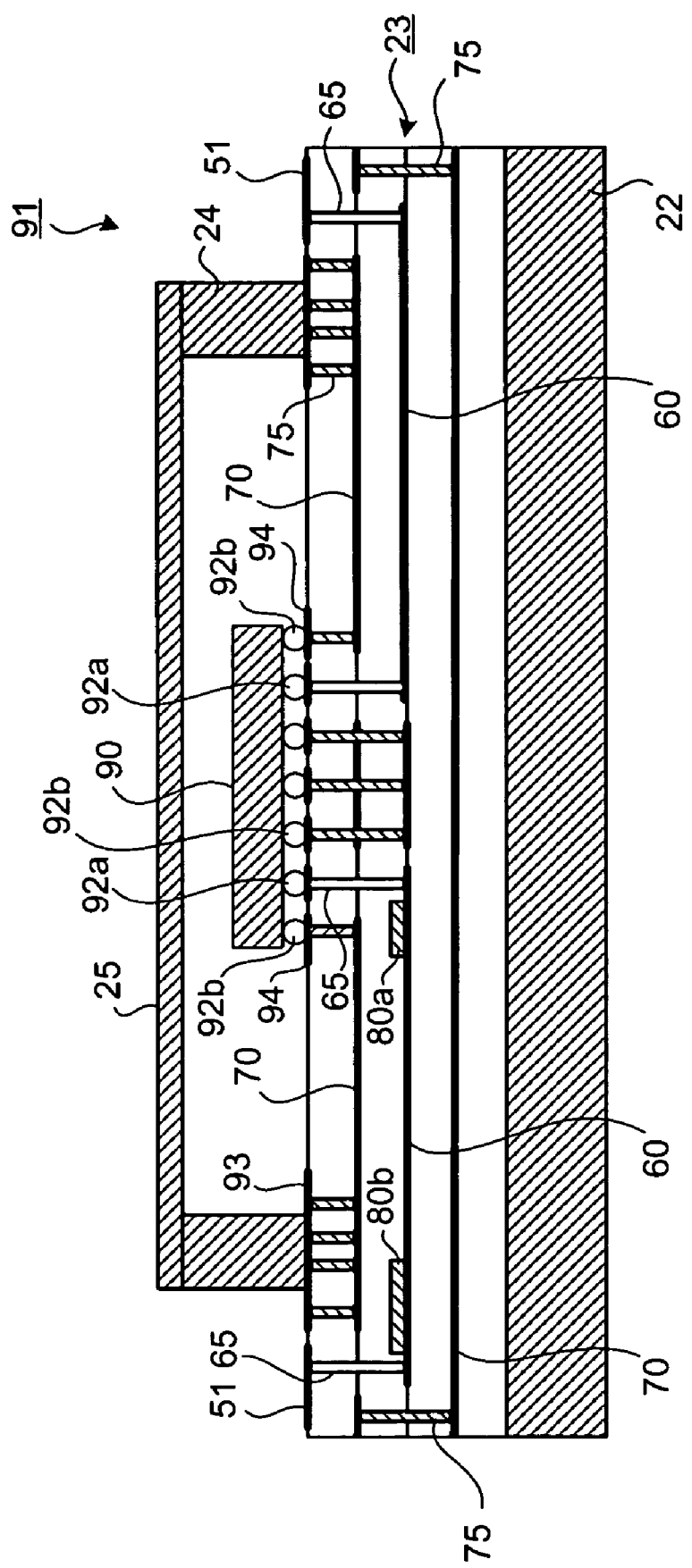
FIG. 26 is a cross-section of a high-frequency package according to a sixth embodiment of the present invention.

The flip-chip high-frequency semiconductor 90 shown in FIG. 26 has many bumps 92 on its bottom surface. The high-frequency semiconductor 90 is connected to the multilayer dielectric substrate 23 via these bumps 92. A reference numeral 92*a* denotes a signal bump, and 92*b* denotes a ground bump.

The multilayer dielectric substrate 23 is formed on the grounded carrier 22. The seal ring 24 and the cover 25 are formed on the multilayer dielectric substrate 23. The high-frequency semiconductor 90 is shielded with the seal ring 24 and the cover 25. The high-frequency semiconductor 90 is mounted by the flip-chip bonding on a conductor pad 94 provided on the upper surface of the multilayer dielectric substrate 23. The surface-layer ground conductor 93, the internal-layer ground conductor 70, and the internal-layer signal line 60 are suitably formed on each layer of the multilayer dielectric substrate 23, in a similar manner to that of the high-frequency package 2 shown in FIG. 6 according to the first embodiment. The internal-layer ground conductor 70, the surface-layer ground conductor 93, and the carrier 22 are connected to each other with the ground vias 75. The signal bumps 92*a* and the external terminal 51 are connected to each other with the signal vias 65 and the internal-layer signal lines 60.

In the third embodiment [r] the sixth embodiment, a resistance film 80*a* is formed at the signal input side of the internal-layer signal line 60, and a resistance film 80*b* is formed at the signal output side of the internal-layer signal line 60. The resistance films 80*a* and 80*b* absorb the high-frequency signal based on the skin effect. Consequently, a high-frequency signal can be suppressed from being discharged to outside the high-frequency package 2 via the signal vias 65, the internal-layer signal lines 60, and the external terminal 51.

The characteristic structure (c) can be also applied to the flip-chip high-frequency package.

INDUSTRIAL APPLICABILITY

As explained above, the high-frequency, the transmission/reception module, and the radar device according to the present invention can be used for a radio device that uses electromagnetic waves of a milliwave band and a microwave band at a low cost.

The invention claimed is:
1. A high-frequency package comprising:
    a high-frequency semiconductor including a bias-and-control-signal terminal;
    a multilayer dielectric substrate including:
        a surface-layer ground conductor configured to mount the high-frequency semiconductor;
        at least one first signal via configured to be connected to the bias-and-control-signal terminal;
        at least one second signal via configured to be connected to an external terminal for a bias and control signal;
        at least one internal-layer signal line configured to connect between the first signal via and the second signal via;

at least one internal-layer ground conductor arranged around the first signal via, the second signal via, and the internal-layer signal line;
a plurality of ground vias arranged around the first signal via, the second signal via, and the internal-layer signal line, on the internal-layer ground conductor; and
at least one resistance film arranged on at least one of an upper surface and a lower surface of at least one of the internal-layer signal lines; and
an electromagnetic shielding member configured to cover at least a part of the high-frequency semiconductor, wherein the electromagnetic shielding member covers a region that includes the first signal via, and the second signal via is arranged outside of the region.

2. The high-frequency package according to claim 1, wherein
the resistance film is provided at a portion near the first signal via.

3. The high-frequency package according to claim 1, wherein
the resistance film is provided at portion near the second signal via.

4. The high-frequency package according to claim 1, wherein
the multilayer dielectric substrate further includes:
a cavity having a bottom surface, and configured to accommodate the high-frequency semiconductor therein;
a ground conductor formed on the bottom surface of the cavity; and
a conductor pad configured to be connected to the bias-and-control-signal terminal; and
the first signal via is configured to be connected to the conductor pad with a wire, and
the external terminal is configured to be connected to an external substrate with a wire.

5. The high-frequency package according to claim 1, wherein
a distance between adjacent ground vias is less than approximately a half of an effective wavelength of a high-frequency signal used in the high-frequency semiconductor.

6. A high-frequency package comprising:
a high-frequency semiconductor including a bias-and-control-signal terminal;
a multilayer dielectric substrate including:
a surface-layer ground conductor configured to mount the high-frequency semiconductor;
at least one first signal via configured to be connected to the bias-and-control-signal terminal;
at least one second signal via configured to be connected to an external terminal for a bias and control signal;
at least one internal-layer signal line configured to connect between the first signal via and the second signal via;
at least one internal-layer ground conductor arranged around the first signal via, the second signal via, and the internal-layer signal line;
a plurality of ground vias arranged around the first signal via, the second signal via, and the internal-layer signal line, on the internal-layer ground conductor; and
at least one resistance film arranged on at least one of an upper surface and a lower surface of at least one of the internal-layer signal lines; and
an electromagnetic shielding member configured to cover at least a part of the high-frequency semiconductor, wherein
a slot line having a length approximately a quarter of an effective wavelength of a high-frequency signal used in the high-frequency semiconductor is provided on the internal-layer signal line.

7. The high-frequency package according to claim 6, wherein
the multilayer dielectric substrate includes a conductor pad formed on the surface layer,
the first signal via is configured to be connected to the conductor pad, and
the surface-layer ground conductor is configured to surround, at least partially, the conductor pad through an area at which a dielectric material is exposed.

8. A high-frequency package comprising:
a high-frequency semiconductor including a bias-and-control-signal terminal;
a multilayer dielectric substrate including:
a surface-layer ground conductor configured to mount the high-frequency semiconductor;
at least one first signal via configured to be connected to the bias-and-control-signal terminal;
at least one second signal via configured to be connected to an external terminal for a bias and control signal;
at least one internal-layer signal line configured to connect between the first signal via and the second signal via;
at least one internal-layer ground conductor arranged around the first signal via, the second signal via, and the internal-layer signal line;
a plurality of ground vias arranged around the first signal via, the second signal via, and the internal-layer signal line, on the internal-layer ground conductor; and
at least one resistance film arranged on at least one of an upper surface and a lower surface of at least one of the internal-layer signal lines; and
an electromagnetic shielding member configured to cover at least a part of the high-frequency semiconductor, wherein the electromagnetic shielding member covers a region that includes the first signal via, and the second signal via is arranged outside of the region, wherein
a low-pass filter configured to suppress passage of a high-frequency signal used in the high-frequency semiconductor is provided on the internal-layer signal line.

9. A high-frequency package comprising:
a high-frequency semiconductor including a bias-and-control-signal terminal;
a multilayer dielectric substrate including:
a surface-layer ground conductor configured to mount the high-frequency semiconductor;
at least one first signal via configured to be connected to the bias-and-control-signal terminal;
at least one second signal via configured to be connected to an external terminal for a bias and control signal;
at least one internal-layer ground conductor configured to be connected to the surface-layer ground conductor; and
at least one internal-layer signal line configured to connect between the first signal via and the second signal via;
a first ground via string arranged at a portion closer to the high-frequency semiconductor than the first signal via, and including a plurality of ground vias configured to be connected to the internal-layer ground conductor; and a second ground via string arranged between the first signal via and the second signal via, and including a plurality of ground vias configured to be connected to the internal-layer ground conductor, wherein a distance between the first ground via string and the second ground via string is less than a half of an effective wavelength of a high-frequency signal used in the high-frequency semiconductor, and a distance between adjacent ground vias in the first ground via string and the second ground via string is less than a half of the effective wavelength.

10. The high-frequency package according to claim 9, wherein the second ground via string is arranged under a portion at which the electromagnetic shielding member contacts the multilayer dielectric substrate.

11. A high-frequency package comprising:
a high-frequency semiconductor including a bias-and-control-signal terminal;
a multilayer dielectric substrate including:
a cavity having a bottom surface and a sidewall that is configured to be non-grounded;
a surface-layer ground conductor arranged on the bottom surface and configured to mount the high-frequency semiconductor;
at least one first signal via configured to be connected to the bias-and-control-signal terminal;
at least one second signal via configured to be connected to an external terminal for a bias and control signal;
at least one internal-layer ground conductor configured to be connected to the surface-layer ground conductor; and
at least one internal-layer signal line configured to connect between the first signal via and the second signal via;
a first ground via string arranged at a portion closer to the high-frequency semiconductor than the first signal via and close to the sidewall, and including a plurality of ground vias configured to be connected to the internal-layer ground conductor; and
a second ground via string arranged between the first signal via and the second signal via, and including a plurality of ground vias configured to be connected to the internal-layer ground conductor, wherein
a distance between the first ground via string and the second ground via string is less than a half of an effective wavelength of a high-frequency signal used in the high-frequency semiconductor, and
a distance between adjacent ground vias in the first ground via string and the second ground via string is less than a half of the effective wavelength.

12. The high-frequency package according to claim 11, wherein a part of each of the ground vias in the first ground via string is exposed to the sidewall.

13. The high-frequency package according to claim 11, wherein an area in which a dielectric material is exposed is formed at a portion on the surface of the multilayer dielectric substrate, the portion between the electromagnetic shielding member and the sidewall.

14. A high-frequency package comprising:
a high-frequency semiconductor including a bias-and-control-signal terminal;
a multilayer dielectric substrate including:
a cavity having a bottom surface;
a surface-layer ground conductor arranged on the bottom surface and configured to mount the high-frequency semiconductor;
at least one first signal via configured to be connected to the bias-and-control-signal terminal;
at least one second signal via configured to be connected to an external terminal for a bias and control signal;
at least one internal-layer ground conductor configured to be connected to the surface-layer ground conductor; and
at least one internal-layer signal line configured to connect between the first signal via and the second signal via;
a sidewall ground pattern formed on a sidewall of the cavity; and
a ground via string arranged between the first signal via and the second signal via, and including a plurality of ground vias configured to be connected to the internal-layer ground conductor, wherein
a distance between the sidewall ground pattern and the ground via string is less than a half of an effective wavelength of a high-frequency signal used in the high-frequency semiconductor, and
a distance between adjacent ground vias in the ground via string is less than a half of the effective wavelength.

15. The high-frequency package according to claim 14, wherein an area in which a dielectric material is exposed is formed at a portion on the surface of the multilayer dielectric substrate, the portion between the electromagnetic shielding member and the sidewall.

16. A high-frequency package comprising:
a high-frequency semiconductor including a bias-and-control-signal terminal;
a multilayer dielectric substrate including:
a cavity having a bottom surface;
a surface-layer ground conductor arranged on the bottom surface and configured to mount the high-frequency semiconductor; and
at least one internal-layer ground conductor configured to be connected to the surface-layer ground conductor;
at least one first signal via configured to be connected to the bias-and-control-signal terminal;
at least one second signal via configured to be connected to an external terminal for a bias and control signal;
at least one internal-layer signal line configured to connect between the first signal via and the second signal via; and
a ground via string arranged between the first signal via and the second signal via, and including a plurality of ground vias configured to be connected to the internal-layer ground conductor, wherein
a distance between the sidewall and the ground via string is less than a quarter of an effective wavelength of a high-frequency signal used in the high-frequency semiconductor, and
a distance between adjacent ground vias in the ground via string is less than a half of the effective wavelength.

17. The high-frequency package according to claim 16, wherein
an area in which a dielectric material is exposed is formed at a portion on the surface of the multilayer dielectric substrate, the portion between the electromagnetic shielding member and the sidewall.

18. A high-frequency package comprising:
a high-frequency semiconductor including a ground terminal and a bias-and-control-signal terminal on a rear surface thereof;
a plurality of conductor pads configured to mount the high-frequency semiconductor by flip-chip bonding;
a multilayer dielectric substrate including:
  a plurality of signal vias configured to be connected to the bias-and-control-signal terminal;
  at least one internal-layer signal line configured to connect between the signal vias; and
  a plurality of ground via string configured to be connected to the internal-layer ground conductor and to surround the signal vias;
at least one internal-layer ground conductor configured to be connected to the ground terminal; and
an electromagnetic shielding member configured to cover at least a part of the high-frequency semiconductor, wherein
a distance between the ground via strings sandwiching the signal vias is less than a half of an effective wavelength of a high-frequency signal used in the high-frequency semiconductor.

19. A transmission/reception module comprising:
a high-frequency package including:
  a high-frequency semiconductor including a bias-and-control-signal terminal;
  a multilayer dielectric substrate including:
    a surface-layer ground conductor configured to mount the high-frequency semiconductor;
    at least one first signal via configured to be connected to the bias-and-control-signal terminal;
    at least one second signal via configured to be connected to an external terminal for a bias and control signal;
    at least one internal-layer signal line configured to connect between the first signal via and the second signal via;
    at least one internal-layer ground conductor arranged around the first signal via, the second signal via, and the internal-layer signal line configured to connect between the first signal via and the second signal via;
    a plurality of ground vias arranged around the first signal via, the second signal via, and the internal-layer signal line, on the internal-layer ground conductor; and
    at least one resistance film arranged on at least one of an upper surface and a lower surface of at least one of the internal-layer signal lines; and
  an electromagnetic shielding member configured to cover at least a part of the high-frequency semiconductor, wherein the electromagnetic shielding member covers a region that includes the first signal via, and the second signal via is arranged outside of the region;
a waveguide terminal configured to input and output a transmission wave and a reception wave between the high-frequency package and the high-frequency semiconductor; and
an external substrate configured to supply a bias signal to the high-frequency semiconductor, to exchange a control signal with the high-frequency semiconductor, and to control to modulate a transmission wave output from the high-frequency semiconductor.

20. A transmission/reception module comprising:
a high-frequency package including:
  a high-frequency semiconductor including a bias-and-control-signal terminal;
  a multilayer dielectric substrate including:
    a surface-layer ground conductor configured to mount the high-frequency semiconductor;
    at least one first signal via configured to be connected to the bias-and-control-signal terminal;
    at least one second signal via configured to be connected to an external terminal for a bias and control signal;
    at least one internal-layer signal line configured to connect between the first signal via and the second signal via;
    at least one internal-layer ground conductor arranged around the first signal via, the second signal via, and the internal-layer signal line;
    a plurality of ground vias arranged around the first signal via, the second signal via, and the internal-layer signal line, on the internal-layer ground conductor; and
    at least one resistance film arranged on at least one of an upper surface and a lower surface of at least one of the internal-layer signal lines; and
  an electromagnetic shielding member configured to cover at least a part of the high-frequency semiconductor, wherein
  a slot line having a length approximately a quarter of an effective wavelength of a high-frequency signal used in the high-frequency semiconductor is provided on the internal-layer signal line;
a waveguide terminal configured to input and output a transmission wave and a reception wave between the high-frequency package and the high-frequency semiconductor; and
an external substrate configured to supply a bias signal to the high-frequency semiconductor, to exchange a control signal with the high-frequency semiconductor, and to control to modulate a transmission wave output from the high-frequency semiconductor.

21. A transmission/reception module comprising:
a high-frequency package including:
  a high-frequency semiconductor including a bias-and-control-signal terminal;
  a multilayer dielectric substrate including:
    a surface-layer ground conductor configured to mount the high-frequency semiconductor;
    at least one first signal via configured to be connected to the bias-and-control-signal terminal;
    at least one second signal via configured to be connected to an external terminal for a bias and control signal;
    at least one internal-layer signal line configured to connect between the first signal via and the second signal via;
    at least one internal-layer ground conductor arranged around the first signal via, the second signal via, and the internal-layer signal line;

a plurality of ground vias arranged around the first signal via, the second signal via, and the internal-layer signal line, on the internal-layer ground conductor; and at least one resistance film arranged on at least one of an upper surface and a lower surface of at least one of the internal-layer signal lines; and an electromagnetic shielding member configured to cover at least a part of the high-frequency semiconductor, wherein the electromagnetic shielding member covers a region that includes the first signal via, and the second signal via is arranged outside of the region, wherein a low-pass filter configured to suppress passage of a high-frequency signal used in the high-frequency semiconductor is provided on the internal-layer signal line;

a waveguide terminal configured to input and output a transmission wave and a reception wave between the high-frequency package and the high-frequency semiconductor; and an external substrate configured to supply a bias signal to the high-frequency semiconductor, to exchange a control signal with the high-frequency semiconductor, and to control to modulate a transmission wave output from the high-frequency semiconductor.

22. A transmission/reception module comprising:
a high-frequency package including:
   a high-frequency semiconductor including a bias-and-control-signal terminal;
   a multilayer dielectric substrate including:
      a surface-layer ground conductor configured to mount the high-frequency semiconductor;
      at least one first signal via configured to be connected to the bias-and-control-signal terminal;
      at least one second signal via configured to be connected to an external terminal for a bias and control signal;
      at least one internal-layer ground conductor configured to be connected to the surface-layer ground conductor; and
      at least one internal-layer signal line configured to connect between the first signal via and the second signal via;
   a first ground via string arranged at a portion closer to the high-frequency semiconductor than the first signal via, and including a plurality of ground vias configured to be connected to the internal-layer ground conductor; and
   a second ground via string arranged between the first signal via and the second signal via, and including a plurality of ground vias configured to be connected to the internal-layer ground conductor, wherein
   a distance between the first ground via string and the second ground via string is less than a half of an effective wavelength of a high-frequency signal used in the high-frequency semiconductor, and
   a distance between adjacent ground vias in the first ground via string and the second ground via string is less than a half of the effective wavelength;
a waveguide terminal configured to input and output a transmission wave and a reception wave between the high-frequency package and the high-frequency semiconductor; and
an external substrate configured to supply a bias signal to the high-frequency semiconductor, to exchange a control signal with the high-frequency semiconductor, and to control to modulate a transmission wave output from the high-frequency semiconductor.

23. A transmission/reception module comprising:
a high-frequency package including:
   a high-frequency semiconductor including a bias-and-control-signal terminal;
   a multilayer dielectric substrate including:
      a cavity having a bottom surface and a sidewall that is configured to be non-grounded;
      a surface-layer ground conductor arranged on the bottom surface and configured to mount the high-frequency semiconductor;
      at least one first signal via configured to be connected to the bias-and-control-signal terminal;
      at least one second signal via configured to be connected to an external terminal for a bias and control signal;
      at least one internal-layer ground conductor configured to be connected to the surface-layer ground conductor; and
      at least one internal-layer signal line configured to connect between the first signal via and the second signal via;
   a first ground via string arranged at a portion closer to the high-frequency semiconductor than the first signal via and close to the sidewall, and including a plurality of ground vias configured to be connected to the internal-layer ground conductor; and
   a second ground via string arranged between the first signal via and the second signal via, and including a plurality of ground vias configured to be connected to the internal-layer ground conductor, wherein
   a distance between the first ground via string and the second ground via string is less than a half of an effective wavelength of a high-frequency signal used in the high-frequency semiconductor, and
   a distance between adjacent ground vias in the first ground via string and the second ground via string is less than a half of the effective wavelength;
a waveguide terminal configured to input and output a transmission wave and a reception wave between the high-frequency package and the high-frequency semiconductor; and
an external substrate configured to supply a bias signal to the high-frequency semiconductor, to exchange a control signal with the high-frequency semiconductor, and to control to modulate a transmission wave output from the high-frequency semiconductor.

24. A transmission/reception module comprising:
a high-frequency package including:
   a high-frequency semiconductor including a bias-and-control-signal terminal;
   a multilayer dielectric substrate including:
      a cavity having a bottom surface;
      a surface-layer ground conductor arranged on the bottom surface and configured to mount the high-frequency semiconductor;
      at least one first signal via configured to be connected to the bias-and-control-signal terminal;
      at least one second signal via configured to be connected to an external terminal for a bias and control signal;
      at least one internal-layer ground conductor configured to be connected to the surface-layer ground conductor; and at least one internal-layer signal line configured to connect between the first signal via and the second signal via;
a sidewall ground pattern formed on a sidewall of the cavity; and
a ground via string arranged between the first signal via and the second signal via, and including a plurality of ground vias configured to be connected to the internal-layer ground conductor, wherein
a distance between the sidewall ground pattern and the ground via string is less than a half of an effective wavelength of a high-frequency signal used in the high-frequency semiconductor, and
a distance between adjacent ground vias in the ground via string is less than a half of the effective wavelength;
a waveguide terminal configured to input and output a transmission wave and a reception wave between the high-frequency package and the high-frequency semiconductor; and
an external substrate configured to supply a bias signal to the high-frequency semiconductor, to exchange a control signal with the high-frequency semiconductor, and to control to modulate a transmission wave output from the high-frequency semiconductor.

25. A transmission/reception module comprising:
a high-frequency package including:
a high-frequency semiconductor including a bias-and-control-signal terminal;
a multilayer dielectric substrate including:
a cavity having a bottom surface;
a surface-layer ground conductor arranged on the bottom surface and configured to mount the high-frequency semiconductor; and
at least one internal-layer ground conductor configured to be connected to the surface-layer ground conductor;
at least one first signal via configured to be connected to the bias-and-control-signal terminal;
at least one second signal via configured to be connected to an external terminal for a bias and control signal;
at least one internal-layer signal line configured to connect between the first signal via and the second signal via; and
a ground via string arranged between the first signal via and the second signal via, and including a plurality of ground vias configured to be connected to the internal-layer ground conductor, wherein
a distance between the sidewall and the ground via string is less than a quarter of an effective wavelength of a high-frequency signal used in the high-frequency semiconductor, and
a distance between adjacent ground vias in the ground via string is less than a half of the effective wavelength;
a waveguide terminal configured to input and output a transmission wave and a reception wave between the high-frequency package and the high-frequency semiconductor; and
an external substrate configured to supply a bias signal to the high-frequency semiconductor, to exchange a control signal with the high-frequency semiconductor, and to control to modulate a transmission wave output from the high-frequency semiconductor.

26. A transmission/reception module comprising:
a high-frequency package including:
a high-frequency semiconductor including a ground terminal and a bias-and-control-signal terminal on a rear surface thereof;
a plurality of conductor pads configured to mount the high-frequency semiconductor by flip-chip bonding;
a multilayer dielectric substrate including:
a plurality of signal vias configured to be connected to the bias-and-control-signal terminal;
at least one internal-layer signal line configured to connect between the signal vias; and
a plurality of ground via string configured to be connected to the internal-layer ground conductor and to surround the signal vias;
at least one internal-layer ground conductor configured to be connected to the ground terminal; and
an electromagnetic shielding member configured to cover at least a part of the high-frequency semiconductor, wherein
a distance between the ground via strings sandwiching the signal vias is less than a half of an effective wavelength of a high-frequency signal used in the high-frequency semiconductor;
a waveguide terminal configured to input and output a transmission wave and a reception wave between the high-frequency package and the high-frequency semiconductor; and
an external substrate configured to supply a bias signal to the high-frequency semiconductor, to exchange a control signal with the high-frequency semiconductor, and to control to modulate a transmission wave output from the high-frequency semiconductor.

27. A radar device comprising:
a transmission/reception module including:
a high-frequency package comprising:
a high-frequency semiconductor including a bias-and-control-signal terminal;
a multilayer dielectric substrate including:
a surface-layer ground conductor configured to mount the high-frequency semiconductor;
at least one first signal via configured to be connected to the bias-and-control-signal terminal;
at least one second signal via configured to be connected to an external terminal for a bias and control signal;
at least one internal-layer signal line configured to connect between the first signal via and the second signal via;
at least one internal-layer ground conductor arranged around the first signal via, the second signal via, and the internal-layer signal line;
a plurality of ground vias arranged around the first signal via, the second signal via, and the internal-layer signal line, on the internal-layer ground conductor; and
at least one resistance film arranged on at least one of an upper surface and a lower surface of at least one of the internal-layer signal lines; and
an electromagnetic shielding member configured to cover at least a part of the high-frequency semiconductor, wherein the electromagnetic shielding member covers a region that includes the first signal via, and the second signal via is arranged outside of the region;

a waveguide terminal configured to input and output a transmission wave and a reception wave between the high-frequency package and the high-frequency semiconductor; and an external substrate configured to supply a bias signal to the high-frequency semiconductor, to exchange a control signal with the high-frequency semiconductor, and to control to modulate a transmission wave output from the high-frequency semiconductor;

an antenna configured to transmit and receive high-frequency signals that are input and output via the waveguide terminal;

an electronic circuit configured to convert an output from the reception system circuit into a low-frequency signal; and a signal processing substrate configured to calculate a distance and a relative speed with respect to a target based on the low-frequency signal.

* * * * *